(12) United States Patent
Lu et al.

(10) Patent No.: US 12,439,692 B2
(45) Date of Patent: Oct. 7, 2025

(54) DISPLAY SUBSTRATE, MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hui Lu, Beijing (CN); Yipeng Chen, Beijing (CN); Shuai Xie, Beijing (CN); Fei Fang, Beijing (CN); Shuo Li, Beijing (CN); Xuewei Tian, Beijing (CN); Ling Shi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/795,887

(22) PCT Filed: Sep. 18, 2021

(86) PCT No.: PCT/CN2021/119351
§ 371 (c)(1),
(2) Date: Jul. 28, 2022

(87) PCT Pub. No.: WO2023/039886
PCT Pub. Date: Mar. 23, 2023

(65) Prior Publication Data
US 2024/0297173 A1  Sep. 5, 2024

(51) Int. Cl.
*H10D 86/60* (2025.01)
*G09G 3/3233* (2016.01)
(Continued)

(52) U.S. Cl.
CPC .......... *H10D 86/60* (2025.01); *G09G 3/3233* (2013.01); *H10D 86/0221* (2025.01);
(Continued)

(58) Field of Classification Search
CPC .. H10D 86/60; H10D 86/0221; H10D 86/423; H10D 86/441; G09G 3/3233;
(Continued)

(56) References Cited

U.S. PATENT DOCUMENTS

2014/0111557 A1  4/2014  Omata et al.
2016/0275869 A1  9/2016  Hwang et al.
(Continued)

FOREIGN PATENT DOCUMENTS

CN  103778886 A  5/2014
CN  205508358 U  8/2016
(Continued)

OTHER PUBLICATIONS

European Search Report for EP22943094.7 Mailed Apr. 7, 2025.

*Primary Examiner* — Elias Ullah
(74) *Attorney, Agent, or Firm* — Ling Wu; Stephen Yang; Ling and Yang Intellectual Property

(57) ABSTRACT

A display substrate, a manufacturing method therefor, and a display apparatus are provided. The display substrate includes a first semiconductor layer, a first conductive layer, a second conductive layer, a second semiconductor layer, a third conductive layer, a fourth conductive layer, and a fifth conductive layer disposed on an substrate. The first semiconductor layer includes active layers of a plurality of poly silicon transistors, the first conductive layer includes gates of a plurality of poly silicon transistors, a first electrode plate of a storage capacitor and a first scan signal line. The second conductive layer includes a second electrode plate of the storage capacitor. The second semiconductor layer includes
(Continued)

active layers of a plurality of oxide transistors. The third conductive layer includes gates of the plurality of oxide transistors.

20 Claims, 14 Drawing Sheets

(51) Int. Cl.
*H10D 86/01* (2025.01)
*H10D 86/40* (2025.01)
*H10K 59/131* (2023.01)

(52) U.S. Cl.
CPC ......... *H10D 86/423* (2025.01); *H10D 86/441* (2025.01); *H10K 59/131* (2023.02); *G09G 2300/0426* (2013.01); *G09G 2300/0465* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01); *G09G 2330/021* (2013.01)

(58) Field of Classification Search
CPC ... G09G 2300/0426; G09G 2300/0465; G09G 2300/0819; G09G 2300/0842; G09G 2300/0861; G09G 2310/08; G09G 2320/0233; G09G 2320/0247; G09G 2330/021; G09G 3/3208; H10K 59/131; H10K 59/1213
See application file for complete search history.

(56) References Cited

U.S. PATENT DOCUMENTS

| | | |
|---|---|---|
| 2018/0190195 A1 | 7/2018 | Asano |
| 2019/0130832 A1 | 5/2019 | Chang |
| 2019/0385522 A1 | 12/2019 | Song et al. |
| 2020/0083474 A1* | 3/2020 | Lee ................ H10K 59/8722 |
| 2021/0126075 A1 | 4/2021 | Wang et al. |
| 2021/0134917 A1 | 5/2021 | Li et al. |

FOREIGN PATENT DOCUMENTS

| | | |
|---|---|---|
| CN | 109686311 A | 4/2019 |
| CN | 109860259 A | 6/2019 |
| CN | 111179828 A | 5/2020 |
| CN | 111354307 A | 6/2020 |
| CN | 113224123 A | 8/2021 |
| CN | 113764438 A | 12/2021 |
| IN | 110619850 A | 12/2019 |
| JP | 2005-338591 A | 12/2005 |
| JP | 2010-97051 A | 4/2010 |
| WO | 2021184274 A1 | 9/2021 |

* cited by examiner

DISPLAY SUBSTRATE, MANUFACTURING METHOD THEREFOR, AND DISPLAY APPARATUS

CROSS-REFERENCE TO RELATED APPLICATION

The present application is a U.S. National Phase Entry of International Application No. PCT/CN2021/119351 having an international filing date of Sep. 18, 2021. The above-identified application is hereby incorporated by reference.

TECHNICAL FIELD

Embodiments of the present disclosure relate to, but are not limited to, the field of display technology, in particular to a display substrate and a manufacturing method therefor, and a display apparatus.

BACKGROUND

An Organic Light Emitting Diode (OLED for short) and a Quantum dot Light Emitting Diode (QLED for short) are active light emitting display devices and have advantages of self-luminescence, a wide viewing angle, a high contrast ratio, low power consumption, an extremely high response speed, lightness and thinness, flexibility, and a low cost, etc. With constant development in display technologies, a flexible display that uses an OLED or a QLED as a light emitting device and performs signal control by a Thin Film Transistor (TFT for short) has become the majority in the field of display at present.

SUMMARY

The following is a summary of subject matters described herein in detail. The summary is not intended to limit the protection scope of claims.

Embodiments of the present disclosure provide a display substrate. In a plane perpendicular to a display substrate, the display substrate includes a first semiconductor layer, a first conductive layer, a second conductive layer, a second semiconductor layer, a third conductive layer, a fourth conductive layer, and a fifth conductive layer disposed on an substrate. The first semiconductor layer includes active layers of a plurality of poly silicon transistors, the first conductive layer includes gates of a plurality of poly silicon transistors, a first electrode plate of a storage capacitor and a first scan signal line. The second conductive layer includes a second electrode plate of the storage capacitor. The second semiconductor layer includes an active layer of a plurality of oxide transistors. The third conductive layer includes gates of the plurality of oxide transistors. The fourth conductive layer includes first electrodes and second electrodes of a plurality of poly silicon transistors and first electrodes and second electrodes of a plurality of oxide transistors. The fifth conductive layer includes a first power supply line and a data signal line. In a plane parallel to the display substrate, the display substrate includes a plurality of sub-pixels, and any two adjacent rows of sub-pixels are symmetrical along an extension direction of the first scan signal line.

In some exemplary embodiments, any two adjacent columns of sub-pixels are symmetrical along an extension direction of the data signal line.

In some exemplary embodiments, the first scan signal line includes a first branch and a second branch, and the fifth conductive layer further includes an anodic connection electrode; an orthographic projection of the first branch of the first scan signal line on the substrate overlaps with an orthographic projection of the anode connection electrode on the substrate.

In some exemplary embodiments, the first power supply lines in two adjacent columns of sub-pixels are connected with each other to form an integrated structure.

In some exemplary embodiments the fourth conductive layer further includes a first initial signal line and a second initial signal line; the plurality of poly silicon transistors comprise a drive transistor, a first reset transistor, and a second reset transistor, and the first reset transistor is configured to reset an anode of a light emitting element through the first initial signal line under a control of the first scan signal line; the second reset transistor is configured to reset a gate of the drive transistor through the second initial signal line under a control of the reset control signal line.

In some exemplary embodiments, the first scan signal line comprises a first branch and a second branch, and an n-th row of sub-pixels and an (n+1)-th row of sub-pixels are symmetrical along the first branch of the first scan signal line, wherein n is a natural number between 1 and N−1, and N is a quantity of a row of sub-pixels; a first reset transistor in the n-th row of sub-pixels is connected with a first scan signal line in an n-th stage, and a second reset transistor in the n-th row of sub-pixels is connected with a reset control signal line in an (n−1)-th stage; a first reset transistor in the (n+1)-th row of sub-pixels is connected with the first scan signal line in the n-th stage, and a second reset transistor in the (n+1)-th row of sub-pixels is connected with a reset control signal line in an (n+1)-th stage.

In some exemplary embodiments, the first reset transistor includes a first reset active layer, the second reset transistor includes a second reset active layer, an extension direction of a channel region of the first reset active layer is the same as an extension direction of the data signal line, and an extension direction of a channel region of the second reset active layer is different from the extension direction of the channel region of the first reset active layer.

In some exemplary embodiments, the display substrate includes a plurality of repetitive units, at least one of which includes a first sub-pixel, a second sub-pixel, a third sub-pixel, and a fourth sub-pixel, and the first reset active layer includes a channel region and first region and second region disposed on both sides of the channel region; the first semiconductor layer includes a plurality of first connect blocks shared, by first reset transistors in the first sub-pixel, the second sub-pixel, the third sub-pixel and the fourth sub-pixel, as a first region of the first reset active layer within at least one of the repetitive units.

In some exemplary embodiments, the first conductive layer further includes a first branch of a first scan signal line extending in a first direction; the first branch of the first scan signal line is provided with an annular aperture structure that comprises a first connect strip and a second connect strip, and the first connect strip and the second connect strip form a first aperture that exposes the first connect blocks, and an orthographic projection of the first connect strip on the substrate overlaps with an orthographic projection of the channel regions of the first reset active layers in the first sub-pixel and the second sub-pixel on the substrate, and an orthographic projection of the second connect strip on the substrate overlaps with an orthographic projection of the channel regions of the first reset active layers in the third sub-pixel and the fourth sub-pixel on the substrate.

In some exemplary embodiments, at least one of the repetitive units includes an eighth via through which the first initial signal line is connected with the first connect blocks, and an orthographic projection of the first aperture on the substrate overlays with an orthographic projection of the eighth via on the substrate.

In some exemplary embodiments, the first conductive layer further includes a reset control signal line, and the second reset active layer includes a channel region and a first region and a second region disposed on both sides of the channel region; the reset control signal line is disposed between two adjacent rows of repetitive units, and the reset control signal line extends in the first direction and is provided with a plurality of first bumps extending in the second direction or a direction opposite to the second direction, and the plurality of first bumps overlap with channel regions of the second reset active layers in the first sub-pixel, the second sub-pixel, the third sub-pixel and the fourth sub-pixel.

In some exemplary embodiments, the second initial signal line is disposed between two adjacent rows of repetitive units, and the second initial signal line extends in the first direction and is provided with a plurality of second bumps extending in the second direction or a direction opposite to the second direction, and the plurality of second bumps are connected to first regions of the second reset active layers in the first sub-pixel, the second sub-pixel, the third sub-pixel and the fourth sub-pixel through a via in an insulating layer.

In some exemplary embodiments, an orthographic projection of the second initial signal line on the substrate overlaps with an orthographic projection of the reset control signal line on the substrate.

In some exemplary embodiments, the first conductive layer further includes a second branch of the first scan signal line, the second conductive layer further includes a first branch of the second scan signal line; both of the second branch of the first scan signal line and the first branch of the second scan signal line extend in the first direction, the second branch of the first scan signal line is provided with a third bump in each sub-pixel, and the first branch of the second scan signal line is provided with a fourth bump in each sub-pixel, and in each sub-pixel, a convex direction of the third bump is opposite to a convex direction of the fourth bump.

In some exemplary embodiments, within each sub-pixel, an orthographic projection of an active layer of the oxide transistor on the substrate overlaps with an orthographic projection of the third bump and fourth bump on the substrate.

In some exemplary embodiments, the third conductive layer further comprises a second branch of the second scan signal line extending in the first direction, and within each sub-pixel, the second branch of the second scan signal line is provided with a fifth bump, and within each sub-pixel, a convex direction of the fifth bump is the same as the convex direction of the fourth bump; within each sub-pixel, an orthographic projection of a second branch of the second scan signal line on the substrate overlaps an orthographic projection of a first branch of the second scan signal line on the substrate.

In some exemplary embodiments, the first conductive layer further includes a light emitting control signal line and the first electrode plate of the storage capacitor; the light emitting control signal line extends in the first direction, and is provided with a sixth bump in each sub-pixel, and a convex direction of the sixth bump in each sub-pixel is a direction away from the first electrode plate of the storage capacitor.

In some exemplary embodiments, the plurality of poly silicon transistors comprise a first light emitting control transistor, and a first light emitting control active layer of the first light emitting control transistor comprises a channel region and a first region and a second region disposed on both sides of the channel region; the first semiconductor layer comprises a plurality of second connect blocks, and second connect blocks are shared, by first light emitting control active layers in two adjacent sub-pixels, as a first region.

A display apparatus is further provided according to an embodiment of the present disclosure, which includes the display substrate as described in any one of the above.

A method for manufacturing a display substrate including a plurality of sub-pixels is further provided in an embodiment of the present disclosure. The method includes forming, sequentially, a first semiconductor layer, a first conductive layer, a second conductive layer, a second semiconductor layer, a third conductive layer, a fourth conductive layer, and a fifth conductive layer on a substrate; wherein the first semiconductor layer comprises active layers of a plurality of poly silicon transistors, the first conductive layer comprises gates of the plurality of poly silicon transistors, a first electrode plate of a storage capacitor and a first scan signal line, the second conductive layer comprises a second electrode plate of the storage capacitor, the second semiconductor layer comprises active layers of a plurality of oxide transistors, the third conductive layer includes gates of the plurality of oxide transistors, the fourth conductive layer comprises first electrodes and second electrodes of the plurality of poly silicon transistors, and first electrodes and second electrodes of the plurality of oxide transistors, and the fifth conductive layer comprises a first power supply line and a data signal line, and any two adjacent rows of sub-pixels are symmetrical in an extension direction of the first scan signal line.

Other aspects may be comprehended upon reading and understanding the drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

FIG. 5b is a sectional view taken along a direction A-A' in FIG. 5a.

FIG. 6b is a sectional view taken along a direction A-A' in FIG. 6a.

FIG. 7b is a sectional view taken along a direction A-A' in FIG. 7a.

FIG. 8b is a sectional view taken along a direction A-A' in FIG. 8a.

FIG. 9b is a sectional view taken along a direction A-A' in FIG. 9a.

FIG. 10b is a sectional view taken along a direction A-A' in FIG. 10a.

FIG. 11b is a sectional view taken along a direction A-A' in FIG. 11a.

FIG. 12b is a sectional view taken along a direction A-A' in FIG. 12a.

FIG. 13b is a sectional view taken along a direction A-A' in FIG. 13a.

FIG. 14b is a sectional view taken along a direction A-A' in FIG. 14a.

FIG. 15c is a sectional view taken along a direction A-A' in FIG. 15a.

DETAILED DESCRIPTION

Figure 1:
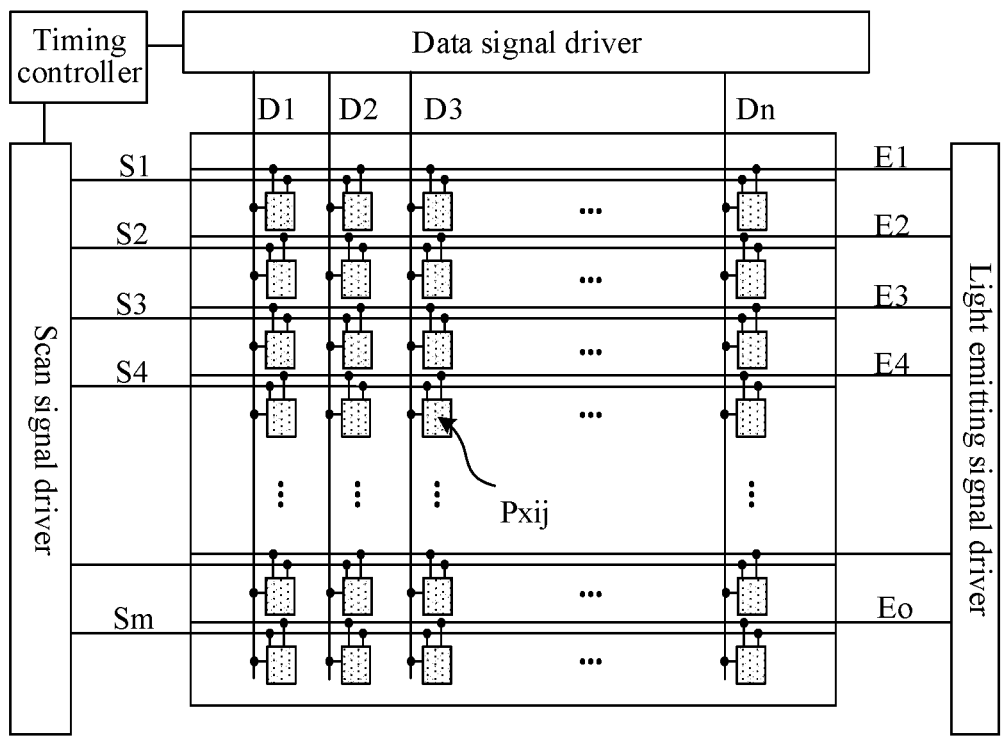
FIG. 1 is a schematic diagram of a structure of a display apparatus according to an embodiment of the present disclosure.

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that embodiments and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of each constituent element, and a thickness of a layer or a region are exaggerated sometimes for clarity. Therefore, one embodiment of the present disclosure is not necessarily limited to the size, and shapes and sizes of various components in the drawings do not reflect actual scales. In addition, the drawings schematically illustrate ideal examples, and one embodiment of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Alternatively, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulate thin film" may be replaced with an "insulate layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a timing controller, a data signal driver, a scan signal driver, a light emitting signal driver, and a pixel array, wherein the pixel array may include a plurality of scan signal lines (S1 to Sm), a plurality of data signal lines (D1 to Dn), a plurality of light emitting signal lines (E1 to Eo), and a plurality of sub-pixels Pxij. In some exemplary implementations, the timing controller may provide a gray-scale value and a control signal which are suitable for a specification of the data signal driver to the data signal driver, provide a clock signal, a scan start signal, etc., which are suitable for a specification of the scan signal driver to the scan signal driver, and provide a clock signal, an emission stop signal, etc., which are suitable for a specification of the light emitting signal driver to the light emitting signal driver. The data signal driver may generate a data voltage to be provided to the data signal lines D1, D2, D3, . . . , and Dn using the gray-scale value and the control signal that are received from the timing controller. For example, the data signal driver may sample the gray-scale value using the clock signal and apply a data voltage corresponding to the gray-scale value to the data signal lines D1 to Dn by taking a pixel row as a unit, wherein n may be a natural number. The scan signal driver may receive the clock signal, the scan start signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register to generate a scan signal in a manner of sequentially transmitting the scan start signal, provided in a form of an on-level pulse, to a circuit in a next stage under a control of the clock signal, wherein m may be a natural number. The light emitting signal driver may receive the clock signal, the emission stop signal, etc., from the timing controller to generate an emission signal to be provided to the light emitting signal lines E1, E2, E3, . . . , and Eo. For example, the light emitting signal driver may sequentially provide an emission signal with an off-level pulse to the light emitting signal lines E1 to Eo. For example, the light emitting signal driver may be constructed in a form of a shift register to generate a light emitting signal in a manner of sequentially transmitting the emission stop signal provided in a form of an off-level pulse to a circuit in a next stage under control of the clock signal, wherein o may be a natural number. The pixel array may include a plurality of sub-pixels Pxij. Each sub-pixel Pxij may be connected with a corresponding data signal line, a corresponding scan signal line, and a corresponding light emitting signal line, wherein i and j may be natural numbers. The sub-pixel Pxij may refer to a sub-pixel with a transistor therein being connected to an i-th scan signal line and connected to a j-th data signal line.

Figure 2:
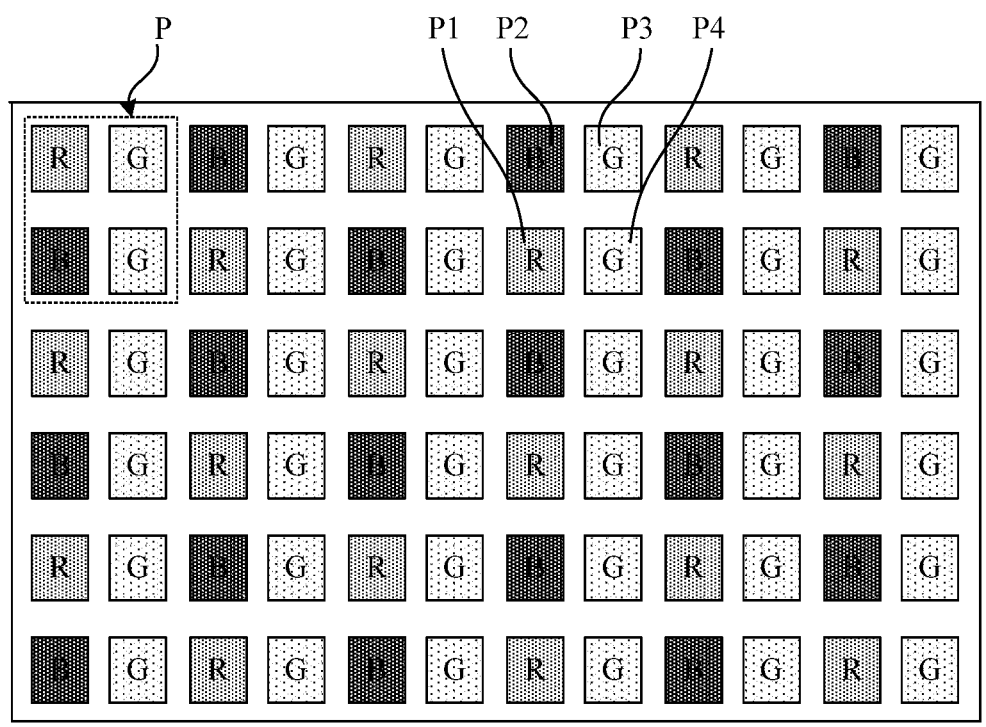
FIG. 2 is a schematic diagram of a planar structure of a display region of a display substrate according to an embodiment of the present disclosure.

FIG. 2 is a schematic diagram of a planar structure of a display area in a display substrate. As shown in FIG. 2, the display substrate may include a plurality of pixel units P arranged in a matrix, at least one of the plurality of pixel units P includes a first sub-pixel P1, a second sub-pixel P2, a third sub-pixel P3 and a fourth sub-pixel P4, wherein each of the first sub-pixel P1, the second sub-pixel P2, the third sub-pixel P3 and the fourth sub-pixel P4 includes a pixel circuit and a light emitting element. The pixel circuits in the first sub-pixel P1, the second sub-pixel P2 the third sub-pixel P3 and the fourth sub-pixel P4 are connected to a scan signal line, a data signal line and a light emitting signal line, respectively. The pixel circuit is configured to receive a data voltage transmitted by the data signal line under a control of the scan signal line and the light emitting signal line, and output a corresponding current to the light emitting element. The light emitting elements in the first sub-pixel P1, the second sub-pixel P2, the third sub-pixel P3 and the fourth sub-pixel P4 are connected, respectively, to the pixel circuits of the sub-pixels where the light emitting elements are located. The light emitting elements is configured to emit light with corresponding brightness in response to the current output by the pixel circuit of the sub-pixel where the light emitting element is located.

In some exemplary implementations, the pixel unit P may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure. In some exemplary implementations, the sub-pixel in the pixel unit may be in a shape of a rectangle, a rhombus, a pentagon, or a hexagon. The pixel unit includes three sub-pixels that may be arranged side by side horizontally, side by side vertically, or in a form of a triangle, alternatively, the pixel unit includes four sub-pixels that may be arranged side by side horizontally, side by side vertically, or in a shape of a square, which is not limited in the present disclosure.

Figure 3:
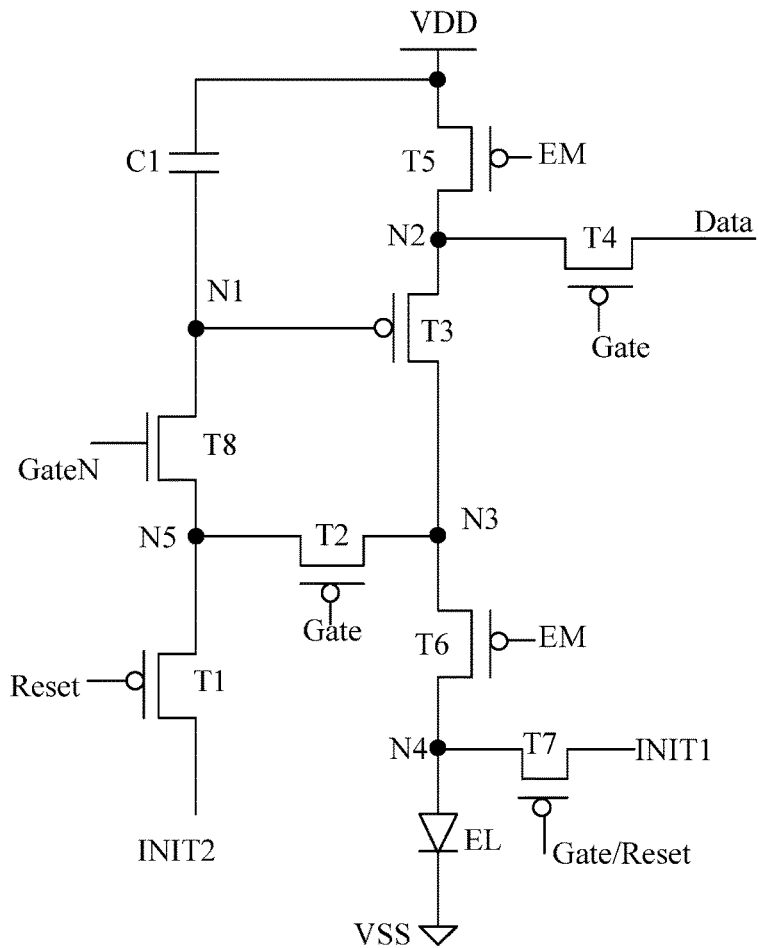
FIG. 3 is an equivalent circuit diagram of a pixel circuit according to an embodiment of the present disclosure.

In some exemplary implementations, the pixel circuit may be in a 3T1C, 4T1C, 5T1C, 5T2C, 6T1C, or 7T1C structure. FIG. 3 is a schematic diagram of an equivalent circuit of a pixel circuit. As shown in FIG. 3, the pixel circuit may include 8 transistors (a first transistor T1 to an eighth transistor T8), 1 storage capacitor C1 and a plurality of signal lines (a data signal line Data, a first scan signal line Gate, a second scan signal line GateN, a reset control signal line Reset, a first initial signal line INIT1, a second initial signal line INIT2, a first power supply line VDD, a second power supply line VSS and a light emitting control signal line EM).

In some exemplary implementations, a gate of the first transistor T1 is connected with the reset control signal line Reset, a first electrode of the first transistor T1 is connected with the second initial signal line INIT2, and a second electrode of the first transistor is connected with a fifth node N5. A gate of the second transistor T2 is connected with the first scan signal line Gate, a first electrode of the second transistor T2 is connected with the fifth node N5, and a second electrode of the second transistor T2 is connected with a third node N3. A gate of the third transistor T3 is connected with a first node N1, a first electrode of the third transistor T3 is connected with a second node N2, and a second electrode of the third transistor T3 is connected with the third node N3. A gate of the fourth transistor T4 is connected with the first scan signal line Gate, a first electrode of the fourth transistor T4 is connected with the data signal line Data, and a second electrode of the fourth transistor T4 is connected with the second node N2. A gate of the fifth transistor T5 is connected with the light emitting control signal line EM, a first electrode of the fifth transistor T5 is connected with the first power supply line VDD, and a second electrode of the fifth transistor T5 is connected to the second node N2. A gate of the sixth transistor T6 is connected with the light emitting control signal line EM, a first electrode of the sixth transistor T6 is connected with the third node N3, and a second electrode of the sixth transistor T6 is connected with the fourth node N4 (i.e., a first electrode of the light emitting element). A gate of the seventh transistor T7 is connected with the first scan signal line Gate, a first electrode of the seventh transistor T7 is connected with the first initial signal line INIT1, and a second electrode of the seventh transistor T7 is connected with the fourth node N4. A gate of the eighth transistor T8 is connected with the second scan signal line GateN, a first electrode of the eighth transistor T8 is connected with the fifth node N5, and a second electrode of the eighth transistor T8 is connected with the first node N1. A first terminal of the storage capacitor C1 is connected to the first power supply line VDD, and a second terminal of the storage capacitor C1 is connected with the second node N1.

In some exemplary implementations, the first transistor T1 to the seventh transistor T7 may be N-type thin film transistors and the eighth transistor T8 may be a P-type thin film transistor; alternatively, the first transistor T1 to the seventh transistor T7 may be P-type thin film transistors and the eighth transistor T8 may be an N-type thin film transistor.

In some exemplary implementations, the first transistor T1 to the seventh transistor T7 may be Low Temperature Poly Silicon (LTPS) Thin Film Transistors (TFT's), and the eighth transistor T8 may be an Indium Gallium Zinc Oxide (IGZO) thin film transistor.

In this embodiment, compared with a low temperature poly silicon thin film transistor, an indium gallium zinc oxide thin film transistor produces less leakage current. Therefore, an indium gallium zinc oxide thin film transistor is used as the eight transistor T8, so that generated leakage current may be significantly reduced, thereby improving flickering of a display panel at a low frequency and a low brightness. Moreover, it is not necessary to use an indium gallium zinc oxide thin film transistor as the first transistor T1 and the second transistor T2, in that a size of the low temperature poly silicon thin film transistor is usually smaller than that of the indium gallium zinc oxide thin film transistor. Therefore, a footprint of the pixel circuit according to the embodiment of the present disclosure is smaller, which is benefit to a resolution of a display panel.

In the pixel circuit according to the embodiment of the disclosure, good switching characteristics of the LTPS-TFTs and low leakage characteristics of the Oxide-TFTs are combined, thereby low-frequency driving (1 Hz~60 Hz) can be achieved, thus significantly reducing a power consumption of a display screen.

In some exemplary implementations, a second electrode of the light emitting element is connected with the second power supply line VSS, a signal of the second power supply line VSS is a low-level signal, and a signal of a first power supply line VDD is a continuously provided high-level signal. A signal of the first scan signal line Gate is a scan signal in a pixel circuit in this display row, and a signal of the reset control signal line Reset is a scan signal line in a pixel circuit in a previous display row, that is, for an n-th display row, the first scan signal line Gate is Gate(n), the reset control signal line Reset is Gate(n−1), a signal of the reset control signal line Reset in this display row may be the same as a signal of the first scan signal line Gate in the pixel circuit in the previous display row, so as to decrease signal lines of a display panel and achieve a narrow bezel of the display panel.

In some exemplary implementations, all of the first scan signal line Gate, the second scan signal line GateN, the reset control signal Reset, the light emitting control signal line EM, the first initial signal line INIT1 and the second initial signal line INIT2 extend in a horizontal direction. All of the second power supply line VSS, the first power supply line VDD and the data signal line Data extend in a vertical direction.

In some exemplary implementations, the light emitting element may be an Organic Light Emitting Diode (OLED), including a first electrode (anode), an organic light emitting layer, and a second electrode (cathode) that are stacked.

Figure 4:
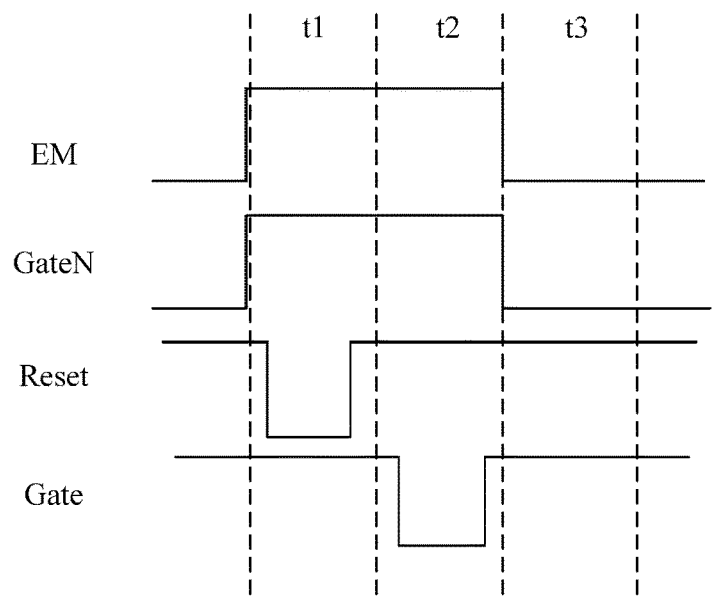
FIG. 4 is a driving timing schematic diagram of the pixel circuit shown in FIG. 3.

FIG. 4 is a timing diagram illustrating working of a pixel circuit. Exemplary embodiments of the present disclosure are described below with reference to a working process of the pixel circuit illustrated in FIG. 4. The pixel circuit in FIG. 3 includes 8 transistors (the first transistor T1 to the eighth transistor T8) and 1 storage capacitor C1 (first capacitor C1). The present embodiment is described by taking an example that the first transistor T1 to the seventh transistor T7 are P-type transistors, the eighth transistor T8 is an N-type transistor, and the gate of the seventh transistor T7 is connected to the first scan signal line Gate.

In some exemplary implementations, the working process of the pixel circuit may include the following stages.

In a first stage t1, which is referred to as a reset stage, signals of the first scan signal line Gate, the second scan signal line GateN and the light emitting control signal line EM are all high-level signals, and the signal of the reset control signal line Reset is a low-level signal. The high-level signal of the light emitting control signal line EM turns off the fifth transistor T5 and the sixth transistor T6, the high-level signal of the second scan signal line GateN turns on the eighth transistor T8, and the low-level signal of the reset control signal line Reset turns on the first transistor T1. Therefore, a voltage at the first node N1 is reset to a second initial voltage Vinit2 provided by the second initial signal line INIT2, then a potential of the reset control signal line Reset is set to be high and the first transistor T1 is turned off. Because the fifth transistor T5 and the sixth transistor T6 are turned off, the light emitting element EL does not emit light in this stage.

In a second stage t2, which is referred to as a data writing stage, the signal of the first scan signal line Gate is a low-level signal, the fourth transistor T4, the second transistor T2 and the seventh transistor T7 are turned on, the data signal line Data outputs the data voltage, and the voltage at the fourth node N4 is reset to the first initial voltage Vinit1 provided by the first initial voltage line INIT1, thereby initialization is completed. In this stage, because the first node N1 is at a low level, the third transistor T3 is turned on.

The fourth transistor T4 and the second transistor T2 are turned on, so that the data voltage output by the data signal line Data is provided to the first node N1 through the turned-on fourth transistor T4, the second node N2, the turned-on third transistor T3, the third node N3, the turned-on second transistor T2, the fifth node N5 and the eighth transistor T8, and the first capacitor C1 is charged with a sum of the data voltage output by the data signal line Data and a threshold voltage of the third transistor T3. A voltage at the second terminal (the first node N1) of the first capacitor C1 is Vdata+Vth, wherein Vdata is the data voltage output by the data signal line Data, and Vth is the threshold voltage of the third transistor T3. The signal of the light emitting control signal line EM is a high-level signal, and the fifth transistor T5 and the sixth transistor T6 are turned off, which make sure that the light emitting element EL does not emit light.

In a third stage t3, which is referred to as a light emitting stage, both of the signals of the first scan signal line Gate and the reset control signal line Reset are high-level signals, and both of the signals of the light emitting control signal line EM and the second scan signal line GateN are low-level signals. The high-level signal of the reset control signal line Reset turns off the seventh transistor T7, and the low-level signal of the light emitting control signal line EM turns on the fifth transistor T5 and the sixth transistor T6. A power supply voltage output by the first power supply line VDD provides a driving voltage to the first electrode of the light emitting element EL (i.e., the fourth node N4) through the fifth transistor T5, the third transistor T3, and the sixth transistor T6, which are all turned on, to drive the light emitting element EL to emit light.

In a driving process for the pixel circuit, a drive current flowing through the third transistor T3 (i.e., the third transistor) is determined by a voltage difference between the gate and the first electrode of the third transistor T3. Because a voltage at the first node N1 is Vdata+Vth, the drive current of the third transistor T3 is as follows.

$$I = K^*(Vgs - Vth)^2 = K^*[(Vdata + Vth - Vdd) - Vth]^2 = K^*[(Vdata - Vdd)]^2$$

Herein, I is the drive current flowing through the third transistor T3, i.e., a drive current for driving the light emitting element EL, K is a constant, Vgs is the voltage difference between the gate electrode and first electrode of the third transistor T3, Vth is the threshold voltage of the third transistor T3, Vdata is the data voltage output by the data signal line Data, and Vdd is the power supply voltage output by the first power supply line VDD.

It may be seen from the above formula that the current I flowing through the light emitting element EL is unrelated to the threshold voltage Vth of the third transistor T3, so that an influence of the threshold voltage Vth of the third transistor T3 on the current I is eliminated, and uniformity of brightness is ensured.

Based on the above-mentioned working sequence, in this pixel circuit, residual positive charges of the light emitting element EL, after the light emitting element EL emitting light last time, are eliminated, compensation to the gate voltage of the third transistor is achieved, an influence of drift of the threshold voltage of the third transistor on a drive current of the light emitting element EL is avoided, and uniformity of a displayed image and display quality of a display panel are improved.

In the pixel circuit according to the embodiment of the present disclosure, by initializing the fourth node N4 to the signal of the first initial signal line INIT1 and initializing the fifth node N5 to the signal of the second initial signal line INIT2, the reset voltage of the light emitting element EL and the reset voltage at the first node N1 can be adjusted respectively, thereby achieving better display effect and improving problems such as flickering at a low frequency.

At present, screen integration technologies are increasing, and people's requirements on display technologies are getting higher and higher. For example, the screen fineness requires higher and higher resolution (Pixels Per Inch, PPI), and both of under display fingerprint and under display camera require higher transmittance of a screen. However, existing display configurations are difficult to meet the requirements of high resolution and high transmittance at the same time.

Figure 5A:
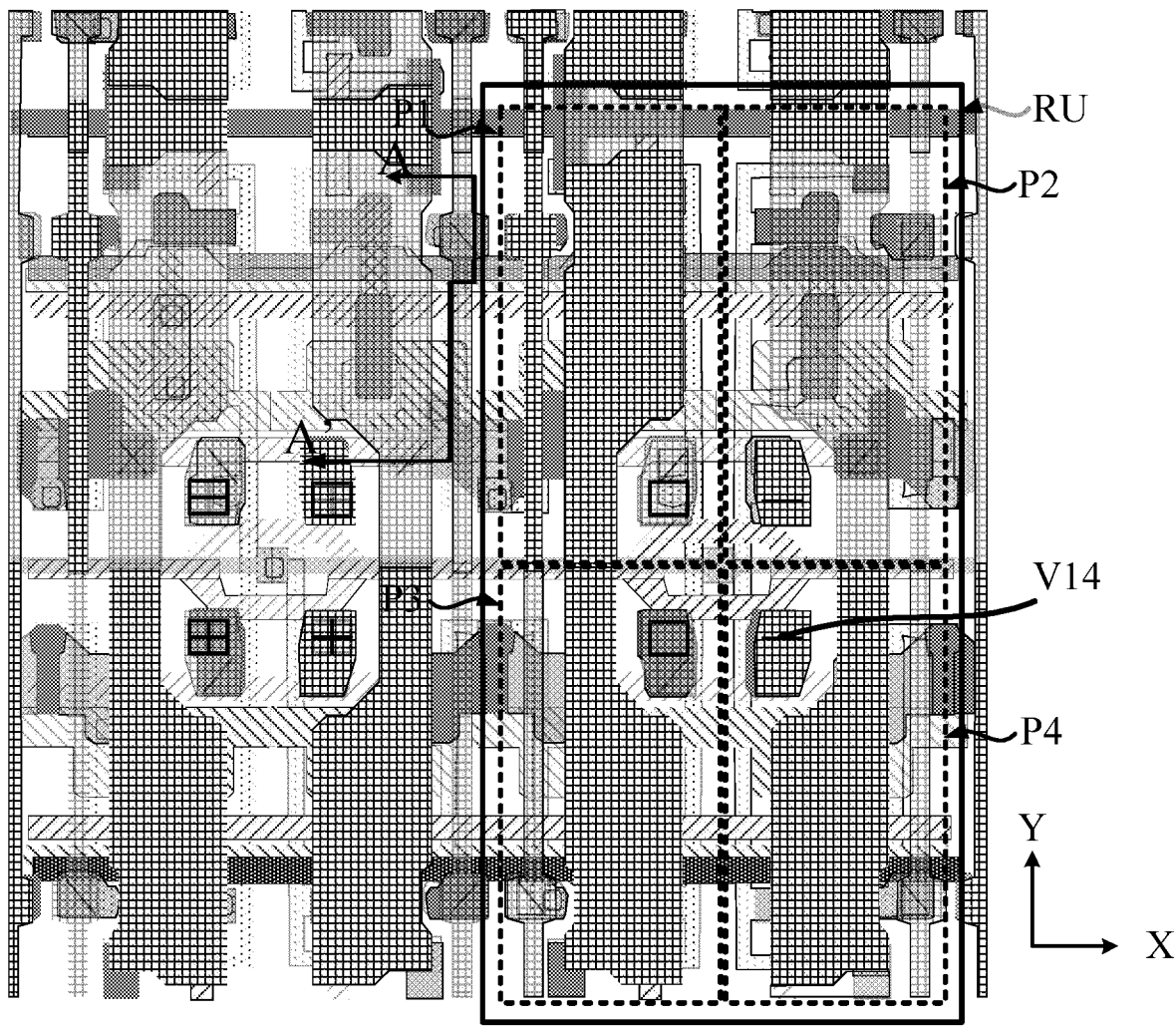
FIG. 5a is a schematic diagram of a planar structure of a display substrate according to an embodiment of the present disclosure.
Figure 5B:
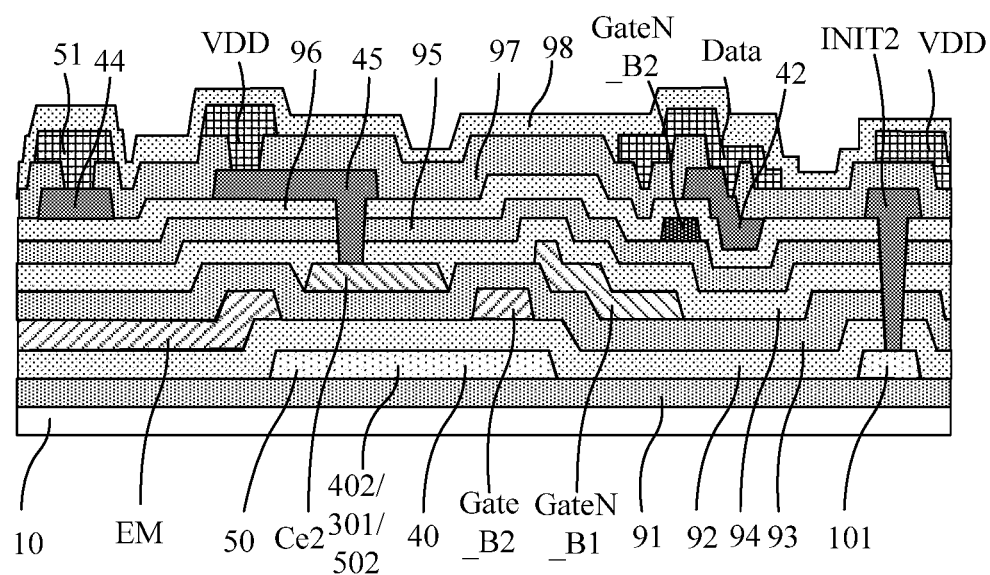

FIG. 5a is a schematic diagram of a planar structure of a display substrate according to an embodiment of the present disclosure, and FIG. 5b is a sectional view taken along an A-A' direction in FIG. 5a. As shown in FIGS. 5a and 5b, in a plane perpendicular to a display substrate, the display substrate includes a first semiconductor layer, a first conductive layer, a second conductive layer, a second semiconductor layer, a third conductive layer, a fourth conductive layer, and a fifth conductive layer disposed on an substrate. The first semiconductor layer includes active layers of a plurality of poly silicon transistors, the first conductive layer includes gates of a plurality of poly silicon transistors, a first electrode plate of a storage capacitor and a first scan signal line. The second conductive layer includes a second electrode plate of the storage capacitor. The second semiconductor layer includes active layers of a plurality of oxide transistors. The third conductive layer includes gates of the plurality of oxide transistors. The fourth conductive layer includes first electrodes and second electrodes of a plurality of poly silicon transistors and first electrodes and second electrodes of a plurality of oxide transistors. The fifth conductive layer includes a first power supply line and a data signal line. In a plane parallel to the display substrate, the display substrate includes a plurality of sub-pixels, and any two adjacent rows of sub-pixels are symmetrical along an extension direction of the first scan signal line.

By making any two adjacent rows of sub-pixels symmetrical along the extension direction of the first scan signal line, the display substrate according to the embodiment of the present disclosure is beneficial to saving pixel layout space, thereby reducing upper and lower bezels to achieve high resolution, and on the other hand, a proportion of non-metallic line areas to overall area can be increased and the transmittance of the Backplane (BP) can be improved.

In some exemplary implementations, any two adjacent columns of sub-pixels are symmetrical along an extension direction of the data signal line.

In some exemplary implementations, the fourth conductive layer further includes a first initial signal line and a second initial signal line.

The plurality of poly silicon transistors include a drive transistor, a first reset transistor (i.e., a seventh transistor T7), and a second reset transistor (i.e., a first transistor T1). The first reset transistor is configured to reset an anode of a light emitting element through a first initial signal line under the control of the first scan signal line. The second reset transistor is configured to reset the gate of the drive transistor through the second initial signal line under the control of the reset control signal line.

In some exemplary implementations, the first scan signal line includes a first branch and a second branch. An n-th row of sub-pixels and an (n+1)-th row of sub-pixels are symmetrical along the first branch of the first scan signal line, wherein n is a natural number between 1 and N−1, and N is a number of a row of sub-pixels.

A first reset transistor (i.e., the seventh transistor T7) in the n-th row of the sub-pixels is connected with a first scan signal line in an n-th stage, and a second reset transistor (i.e., the first transistor T1) in the n-th row of sub-pixels is connected with a reset control signal line in an (n−1)-th stage. A first reset transistor in the (n+1)-th row of sub-pixels is connected with the first scan signal line in the n-th stage, and a second reset transistor in the (n+1)-th row of the sub-pixels is connected with a reset control signal line in the (n+1)-th stage.

In this embodiment, in the driving stage, for one row of sub-pixels in the two adjacent rows of sub-pixels, the pixel circuit resets the anode of the light emitting element first, and then resets the gate of the driving transistor; for another row of sub-pixels in the two adjacent rows of sub-pixels, the pixel circuit resets the gate of the driving transistor first, and then resets the anode of the light emitting element.

In some exemplary implementations, the first reset transistor includes a first reset active layer, the second reset transistor includes a second reset active layer, an extension direction of a channel region of the first reset active layer is the extension direction of the data signal line, an extension direction of a channel region of the second reset active layer is the extension direction of the scan signal line (or the reset control signal line), that is, the extension direction of the channel region of the second reset active layer is different from the extension direction of the channel region of the first reset active layer.

As shown in FIG. 5a, a display substrate is provided according to an embodiment of the present disclosure, which includes a plurality of Repetitive Units (RUs), each of which includes a first repetitive unit group, a second repetitive unit group, a third repetitive unit group, and a fourth repetitive unit group.

In a second direction Y (i.e., a column direction), the first repetitive unit group and third repetitive unit group are alternately arranged and are of an image symmetrical structure, the second repetitive unit group and fourth repetitive unit group are alternately arranged and are of an image symmetrical structure, and the second direction Y is a direction in which the data signal lines extend.

In the display substrate according to the embodiment of the present disclosure, the plurality of repetitive unit groups are in the image symmetrical structure in the second direction Y, which is beneficial to saving the pixel layout space and achieves high resolution, and can increase the proportion of non-metallic line areas to the overall area and improve the transmittance of the Backplane (BP), on the other hand.

In some exemplary implementations, in a first direction X (i.e., a row direction), the first repetitive unit group and the second repetitive unit group are alternately arranged and are of an image symmetrical structure, and the third repetitive unit group and the fourth repetitive unit group are alternately arranged and are of an image symmetrical structure.

In the second direction Y, the first repetitive unit group and third repetitive unit group are alternately arranged and are of an image symmetrical structure, the second repetitive unit group and fourth repetitive unit group are alternately arranged and are of an image symmetrical structure, and the first direction X and the second direction Y intersect.

In the display substrate provided according to the embodiment of the present disclosure, a plurality of sub-pixel groups in the image symmetrical structure in the first direction X and the second direction Y, which is beneficial to saving pixel layout space and achieves high resolution on the one hand, and can increase the proportion of non-metallic line areas to the overall area and improve the transmittance of the Backplane (BP), on the other hand.

In some exemplary implementations, the first repetitive unit group includes a first sub-pixel P1, the second repetitive unit group includes a second sub-pixel P2, the third repetitive unit group includes a third sub-pixel P3, and the fourth repetitive unit group includes a fourth sub-pixel P4.

In the second direction Y, any two adjacent columns of sub-pixels are of an image symmetrical structure. In the first direction X, any two adjacent rows of sub-pixels are of an image symmetrical structure.

In some exemplary implementations, at least one sub-pixel includes a pixel circuit including a first reset transistor (i.e., the seventh transistor T7 in FIG. 3), the first reset active layer of the first reset transistor includes a channel region and a first region and a second region disposed on both sides of the channel region.

In a plane perpendicular to the display substrate, the first semiconductor layer includes a plurality of first connect blocks, first connect blocks are disposed at a center of one Repetitive Unit (RU), the first connect blocks are shared, by the first reset transistors in the first sub-pixel, the second sub-pixel, the third sub-pixel and the fourth sub-pixel, as the first region of the first reset active layer.

In some exemplary implementations, the first branch of the first scan signal line extends in the first direction X and is disposed at the center of the Repetitive Unit (RU) in the first direction X.

The first scan signal line is provided with an annular aperture structure that includes a first connect strip and a second connect strip. The first connect strip and the second connect strip form a first aperture that exposes the first connect block. An orthographic projection of the first connect strip on the substrate overlaps with an orthographic projection of the channel regions of the first reset active layers in the first sub-pixel and the second sub-pixel on the substrate, and an orthographic projection of the second connect strip on the substrate overlaps with an orthographic projection of the channel regions of the first reset active layers in the third sub-pixel and the fourth sub-pixel on the substrate.

In some exemplary implementations, the first initial signal line extends in a first direction X and is disposed at the center of a row of Repetitive Units (RUs) in the first direction X.

Each Repetitive Unit (RU) includes an eighth via provided at the center of the each Repetitive Unit (RU). The first initial signal line is connected to the first connect block through the eighth via, and the orthographic projection of the first aperture on the substrate covers an orthographic projection of the eighth via on the substrate.

In some exemplary implementations, at least one sub-pixel includes a pixel circuit that includes a second reset transistor (i.e., the first transistor T1 in FIG. 3) and a reset control signal line, and a second reset active layer of the second reset transistor includes a channel region and a first region and a second region disposed on both sides of the channel region.

The reset control signal line is disposed between two adjacent rows of Repetitive Units (RUS), and the reset control signal line extends in the first direction X and is provided with a plurality of first bumps extending in the second direction Y or a direction opposite to the second direction Y. The plurality of first bumps overlap with channel regions of the second reset active layers in the first sub-pixel, the second sub-pixel, the third sub-pixel and the fourth sub-pixel.

In some exemplary implementations, the second initial signal line is disposed between two adjacent rows of Repetitive Units (RUs), and the second initial signal line extends in the first direction X and is provided with a plurality of second bumps extending in the second direction Y or a direction opposite to the second direction Y. The plurality of second bumps are connected to first regions of the second reset active layers in the first sub-pixel, the second sub-pixel, the third sub-pixel and the fourth sub-pixel through a via in an insulate layer.

In some exemplary implementations, an orthographic projection of the second initial signal line on the substrate overlaps with an orthographic projection of the reset control signal line on the substrate.

In some exemplary implementations, the first conductive layer further includes the second branch of the first scan signal line, and the second conductive layer further includes the first branch of the second scan signal line.

Both of the second branch of the first scan signal line and the first branch of the second scan signal line extend in the first direction X, the second branch of the first scan signal line is provided with a third bump in each sub-pixel, and the first branch of the second scan signal line is provided with a fourth bump in each sub-pixel, and in each sub-pixel, a convex direction of the third bump is opposite to a convex direction of the fourth bump.

In some exemplary implementations, an orthographic projection of the active layer of the oxide transistor (i.e. the eighth transistor T8 in FIG. 3) on the substrate overlaps with orthographic projections of the third bump and the fourth bump on the substrate.

In some exemplary implementations, the third conductive layer further includes the second branch of the second scan signal line extending in the first direction X, the second branch of the second scan signal line is provided with a fifth bump, the convex directions of the fifth bump and the fourth bump within each sub-pixel is consistent.

In some exemplary implementations, an orthographic projection of the second branch of the second scan signal line on the substrate overlaps with an orthographic projection of the first branch of the second scan signal line on the substrate.

In some exemplary implementations, the first conductive layer further includes a light emitting control signal line and the first electrode plate of the storage capacitor.

The light emitting control signal line extends in a first direction X, and is provided with a sixth bump in each sub-pixel, and a convex direction of the sixth bump in each sub-pixel is a direction away from the first electrode plate of the storage capacitor.

In some exemplary implementations, the pixel circuit further includes a first light emitting control transistor (i.e., a fifth transistor T5 in FIG. 3), a first light emitting control active layer of the first light emitting control transistor includes a channel region and a first region and a second region disposed on both sides of the channel region.

The first semiconductor layer includes a plurality of second connect blocks disposed between adjacent Repetitive Units (RUs) in the first direction X, and the second connect blocks are shared, by first light emitting control active layers in two adjacent sub-pixels, as the first region.

Exemplary description is made below through a manufacturing process for a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on the substrate through a process such as depositing, coating, or the like. If the "thin film" does not need a patterning process in an entire manufacturing process, the "thin film" may also be referred to as a "layer". If the "thin film" needs the patterning process in the entire manufacturing process, it is referred to as a "thin film" before the patterning process, and is referred to as a "layer" after the patterning process. The "layer" after the patterning process includes at least one "pattern". "A and B being disposed on a same layer" mentioned in the present disclosure means that A and B are formed simultaneously through a single patterning process, and a "thickness" of a film layer is a dimension of the film layer in a direction perpendicular to a display substrate. In an exemplary embodiment of the present disclosure, "an orthographic projection of B is within a range of an orthographic projection of A" refers to that a boundary of the orthographic projection of B falls within a boundary range of the orthographic projection of A, or the boundary of the orthographic projection of A overlaps with the boundary of the orthographic projection of B. "An orthographic projection of A including an orthographic projection of B" means that a boundary of the orthographic projection of B falls within a range of boundary of the orthographic projection of A, or a boundary of the orthographic projection of A overlaps with a boundary of the orthographic projection of B.

In some exemplary implementations, a manufacturing process for a display substrate may include the following acts.

Figure 6A:
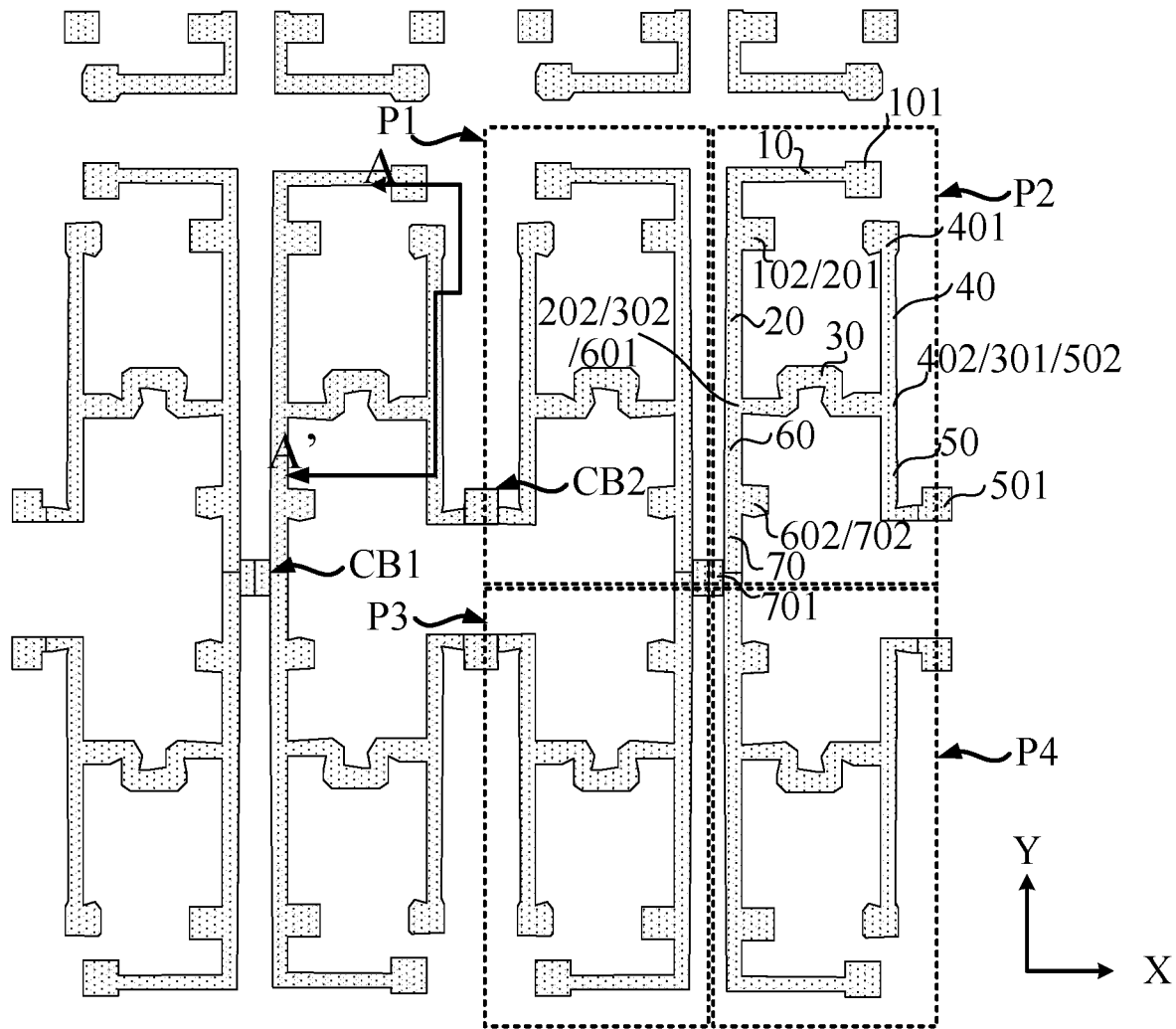
FIG. 6a is a schematic diagram of a display substrate after a pattern of a first semiconductor layer is formed according to an embodiment of the present disclosure.
Figure 6B:
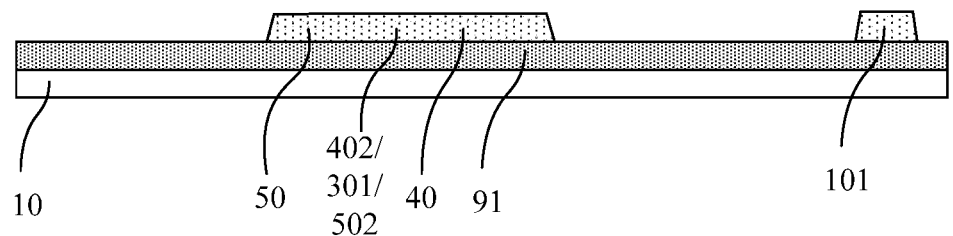

(11) A pattern of a first semiconductor layer is formed. In some exemplary implementations, forming the pattern of the first semiconductor layer may include that a first insulate thin film is first deposited on the substrate that forms a pattern of a first insulate layer 91 covering the entire substrate. Next, a layer of a first active layer thin film is deposited and is patterned by a patterning process to form a pattern of a first semiconductor layer disposed on a buffer layer. The first insulate layer 91 is used for blocking an influence of ions in the substrate on a thin film transistor, and the first insulate layer 91 may be a composite thin film of silicon nitride (SiNx), silicon oxide (SiOx), or SiNx/SiOx, and the first active layer thin film may be made of a silicon material, which includes amorphous silicon and poly silicon. The first active layer thin film may be made of amorphous Silicon (a-Si), and the poly silicon may be formed by crystallization or laser annealing, as shown in FIGS. 6a and 6b, wherein FIG. 6b is a sectional view taken along an A-A' direction in FIG. 6a. The pattern of the first semiconductor layer may include a first active layer 10 (i.e., a second reset active layer) of the first transistor T1, a second active layer 20 of the second transistor T2, a third active layer 30 of the third transistor T3, a fourth active layer 40 of the fourth transistor T4, a fifth active layer 50 of the fifth transistor T5 (i.e., the first light emitting control active layer), a sixth active layer 60 of the sixth transistor T6 and a seventh active layer 70 of the seventh transistor T7 (i.e., the first reset active layer). The first active layer 10, the second active layer 20, the third active layer 30, the fourth active layer 40, the fifth active layer 50, the sixth active layer 60 and the seventh active layer 70 are connected to each other as an integrated structure.

In some exemplary implementations, the third active layer 30 may be in the shape of an "Ω", the second active layer 20, the fourth active layer 40 and the seventh active layer 70 may be in a shape of a "1", and the first active layer 10, the fifth active layer 50, and the sixth active layer 60 may be in a shape of an "L".

In some exemplary implementations, an active layer of each transistor may include a first region, a second region, and a channel region located between the first region and the second region. In some exemplary implementations, a second region 102 of the first active layer 10 serves as a first region 201 of the second active layer 20, that is, the second region 102 of the first active layer 10 is connected to the first region 201 of the second active layer 20. A first region 301 of the third active layer 30 also serves as a second region 402 of the fourth active layer 40 and a second region 502 of the fifth active layer 50, that is, the first region 301 of the third active layer 30, the second region 402 of the fourth active layer 40, and the second region 502 of the fifth active layer 50 are connected to one another. A second region 302 of the third active layer 30 also serves as a first region 601 of the sixth active layer 60 and a second region 202 of the second active layer 20, that is, the second region 302 of the third active layer 30, the first region 601 of the sixth active layer 60 and the second region 202 of the second active layer 20 are connected to each other. A second region 602 of the sixth active layer 16 also serves as a second region 702 of the seventh active layer 70, that is, the second region 602 of the sixth active layer 60 and the second region 702 of the seventh active layer 70 are connected to each other. A first region 101 of the first active layer 10, a first region 401 of the fourth active layer 40, a first region 501 of the fifth active layer 50 and a first region 701 of the seventh active layer 70 are disposed separately.

In some exemplary implementations, first semiconductor layers of any two adjacent columns of sub-pixels are of an image symmetrical structure in the second direction Y, and first semiconductor layers of any two adjacent rows of sub-pixels are of an image symmetrical structure in the first direction X.

In some exemplary implementations, the channel region of the first active layer 10 is extended in a direction different from an extension direction of the channel region of the seventh active layer 70.

In some exemplary implementations, channel regions of the first active layer 10 and the third active layer 30 extend in the row direction, and channel regions of the second active layer 20, the fourth active layer 40, the fifth active layer 50, the sixth active layer 60 and the seventh active layer 70 extend in the column direction. In this way, the upper bezel and lower bezel can be reduced to achieve high resolution.

In some exemplary implementations, the first semiconductor layer includes a plurality of first connect blocks (CB1s) disposed at the center of respective Repetitive Units (RU), and the first connect blocks (CB1s) are shared, by a seventh active layer 70 in the first sub-pixel, a seventh active layer 70 in the second sub-pixel, a seventh active layer 70 in the third sub-pixel, and a seventh active layer 70 in the fourth sub-pixel, as the first region 701.

In some exemplary implementations, the first semiconductor layer includes a plurality of second Connect Blocks (CB2s) disposed between adjacent Repetitive Units (RUs) in the first direction X, and second Connect Blocks (CB2s) are shared, by fifth active layers 50 in two adjacent sub-pixels, as the first region 501.

In some exemplary implementations, the first semiconductor layer may be made of poly silicon (p-Si), that is, all of the first transistor, the second transistor, the third transistor, the fourth transistor, the fifth transistor, the sixth transistor and the seventh transistor may be LTPS thin film transistors.

After this process, the display substrate includes the first insulate layer 91 disposed on the substrate and the first semiconductor layer disposed on the first insulate layer 91. The semiconductor layer may include active layers of a plurality of transistors.

Figure 7A:
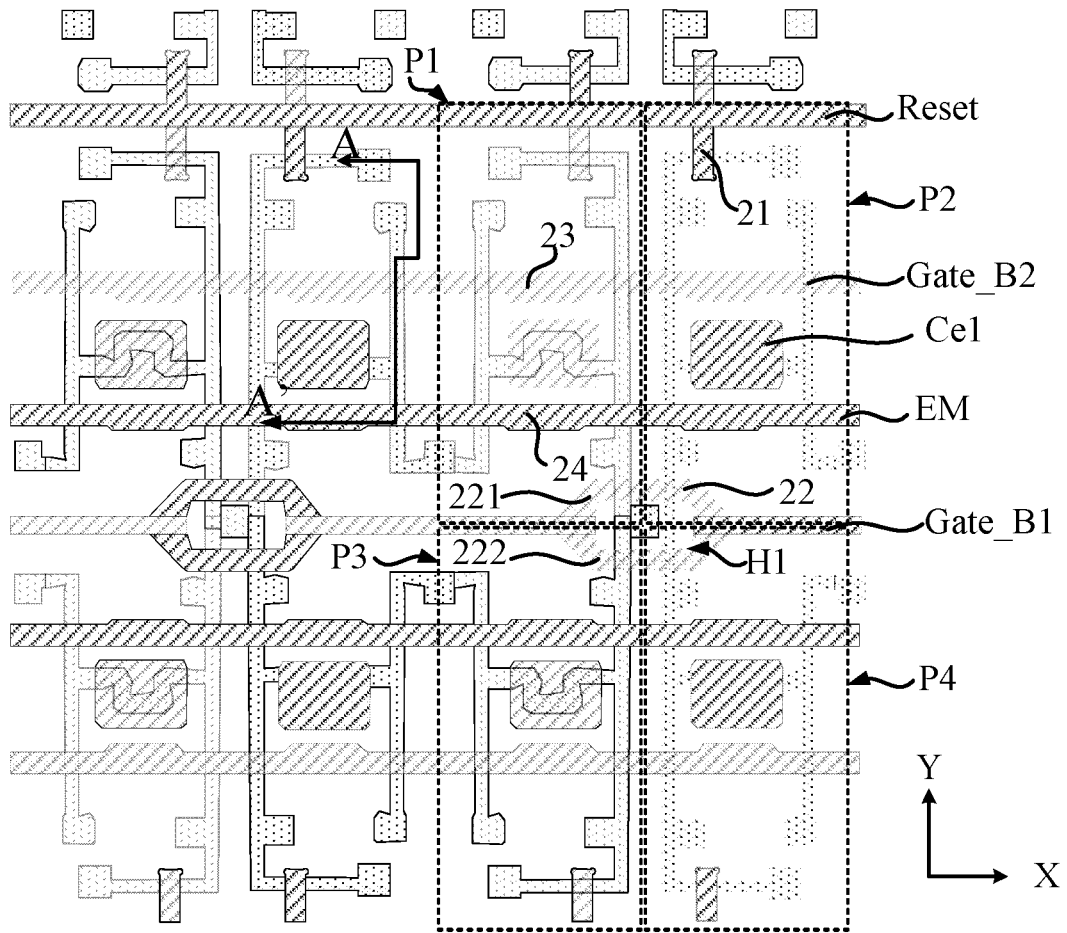
FIG. 7a is a schematic diagram of a display substrate obtained after a pattern of a first conductive layer is formed according to an embodiment of the present disclosure.
Figure 7B:
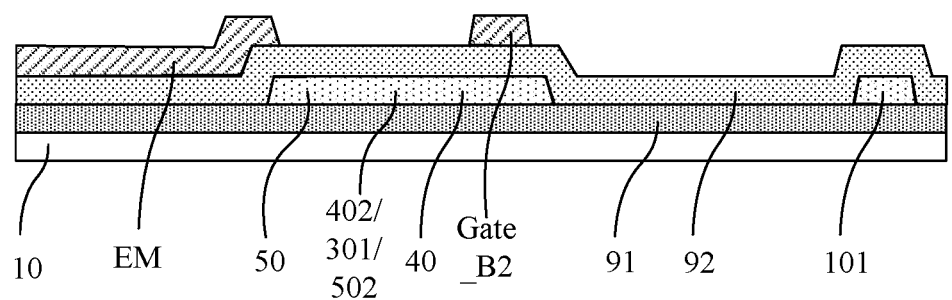

(12) A pattern of a first conductive layer is formed. In some exemplary implementations, forming the pattern of the first conductive layer may include: a second insulate thin film and a first metal thin film are sequentially deposited on the substrate on which the above-mentioned pattern is formed, and the first metal thin film is patterned by a patterning process to form a second insulate layer 92 that covers the pattern of the first semiconductor layer and form the pattern of the first conductive layer disposed on the second insulate layer 92; wherein the first conductive layer pattern at least includes a first branch Gate_B1 of the first scan signal line, a second branch Gate_B2 of the first scan signal line, the reset control signal line Reset, the light emitting control signal line EM and a first electrode plate Ce1 of the storage capacitor, as shown in FIGS. 7a and 7b, wherein FIG. 7b is a sectional view taken along a direction A-A' in FIG. 7a. In some exemplary implementations, the first conductive layer may be referred to as a first gate metal (GATE1) layer.

In some exemplary implementations, first conductive layers of any two adjacent columns of sub-pixels are of an image symmetrical structure in the second direction Y, and first conductive layers of any two adjacent rows of sub-pixels are of an image symmetrical structure in the first direction X.

In some exemplary implementations, all of the first branch Gate_B1 of the first scan signal line, the second branch Gate_B2 of the first scan signal line, the reset control signal line Reset and the light emitting control signal line EM extend in the first direction X. In each sub-pixel, the reset control signal line Reset is located on a side of the second branch Gate_B2 of the first scan signal line away from the light emitting control signal line EM, the first branch Gate_B1 of the first scan signal line is located on a side of the light emitting control signal line EM away from the second branch Gate_B2 of the first scan signal line, and the first electrode plate Ce1 of the storage capacitor is disposed between the second branch Gate_B2 of the first scan signal line and the light emitting control signal line EM.

In some exemplary implementations, the first branch Gate_B1 of the first scan signal line is disposed at the center of the Repetitive Unit (RU) in the first direction X.

In some exemplary implementations, the first branch Gate_B1 of the first scan signal line is provided with an annular aperture structure 22 at the center of each Repetitive Unit (RU), and the annular aperture structure 22 includes a first connect strip 221 and a second connect strip 222, and the first connect strip 221 and the second connect strip 222 form a first aperture H1. The first aperture H1 exposes the first connect block (CB1), an orthographic projection of the first connect strip 221 on the substrate overlaps with the orthographic projection of the channel region of the seventh active layer 70 in the first sub-pixel P1 and the second sub-pixel P2 on the substrate, and the orthographic projection of the second connect strip 222 on the substrate overlaps with an orthographic projection of the channel regions of the seventh active layers 70 in the third sub-pixel P3 and the fourth sub-pixel P4 on the substrate.

A region in which the first connection strip 221 overlaps with the channel regions of the seventh active layers 70 in the first sub-pixel P1 and the second sub-pixel P2 serves as a gate of the seventh transistors T7 in the first sub-pixel P1 and the second sub-pixel P2, and a region in which the second connection strip 222 overlaps with the channel regions of the seventh active layers 70 in the third sub-pixel P3 and the fourth sub-pixel P4 serves as a gate of the seventh transistors T7 in the third sub-pixel P3 and the fourth sub-pixel P4.

In some exemplary implementations, the first electrode plate Ce1 may be in a shape of a rectangle, and corners of the rectangle may be provided with chamfers. There is a region in which an orthographic projection of the first electrode plate Ce1 on the substrate overlaps with an orthographic projection of the third active layer 30 of the third transistor T3 on the substrate. In some exemplary implementations, the first electrode plate Ce1 also serves as a gate of the third transistor T3, and a region in which the third active layer 30 of the third transistor T3 overlaps with the first electrode plate Ce1 serves as a channel region of the third transistor T3. One end of the channel region is connected with the first region of the third active layer 30 and another end of the channel region is connected with the second region of the third active layer 30.

In some exemplary implementations, a reset control signal line is disposed between two adjacent rows of Repetitive Units (RUs).

In some exemplary implementations, the reset control signal line Reset is provided with a plurality of first bumps 21 extending in the second direction Y or a direction opposite to the second direction Y, the plurality of first bumps 21 have overlapped regions with the channel regions of the first active layers 10 in the first sub-pixel P1, the second sub-pixel P2, and the third sub-pixel P3 and the fourth sub-pixel P4, and a region in which the first bumps 21 overlap with the first active layer 10 serves as a gate of the first transistor T1.

In other exemplary implementations, a configuration of the active layer 10 of the first transistor and the reset control signal line Reset may be configured according to a configuration of the active layer 70 of the seventh transistor and the first branch Gate_B1 of the first scan signal line, that is, the channel region of the first active layer 10 may be disposed in the column direction. The first semiconductor layer may further include a plurality of third connect blocks, the third connect blocks (CB3s) are disposed between two adjacent rows of Repetitive Units (RUs), and the third connect blocks are shared, by the first active layer 10 in the first sub-pixel, the first active layer 10 in the second sub-pixel, the first active layer 10 in the third sub-pixel and the first active layer 10 in the fourth sub-pixel, as the first region 101.

In some exemplary implementations, a region in which the second branch Gate B2 of the first scan signal line overlaps with the second active layer of the second transistor T2 serves as the gate of the second transistor T2; a region in which the second branch Gate B2 of the first scan signal line overlaps with the fourth active layer of the fourth transistor T4 serves as the gate of the fourth transistor T4; a region in which the light emitting control signal line EM overlaps with the fifth active layer of the fifth transistor T5 serves as the gate of the fifth transistor T5; and a region in which the light emitting control signal line EM overlaps with the sixth active layer of the sixth transistor T6 serves as the gate of the sixth transistor T6.

In some exemplary implementations, the second branch Gate_B2 of the first scan signal line is provided with the third bump 23 in each sub-pixel, and the convex direction of the third bump 23 in each sub-pixel is a direction towards the first electrode plate Ce1 of the storage capacitor.

In some exemplary implementations, the light emitting control signal line EM is provided with the sixth bump 23 in each sub-pixel, and the convex direction of the sixth bump 24 in each sub-pixel is a direction away from the first electrode plate Ce1 of the storage capacitor. Because the light emitting control signal line EM and the second branch Gate_B2 of the first scan signal line in each sub-pixel are disposed on both sides of the first electrode plate Ce1 of the storage capacitor respectively, therefore the convex direction of the third bump 23 in each sub-pixel is the same as that of the sixth bump 24 in each sub-pixel. The sixth bump 24 can widen the light emitting control signal line EM and decrease a wiring resistance of the light emitting control signal line EM.

In some exemplary implementations, after the pattern of the first conductive layer is formed, the first conductive layer may be used as a shield to perform a conductive treatment on the first semiconductor layer. A region of the first semiconductor layer, which is shielded by the first conductive layer, forms channel regions of the various transistors, and a region of the first semiconductor layer, which is not shielded by the first conductive layer, is made to be conductive, that is, all of the first regions and the second regions of the various active layers are made to be conductive.

After this process, the display substrate includes the first insulating layer 91 disposed on the substrate, the first semiconductor layer disposed on the first insulating layer 91, the second insulating layer 92 covering the first semiconductor layer, and the first conductive layer disposed on the second insulating layer 92. The first conductive layer may include the first branch Gate_B1 of the first scan signal line, the second branch Gate_B2, the reset control signal line Reset, the light emitting control signal line EM and the first electrode plate Ce1 of the storage capacitor.

Figure 8A:
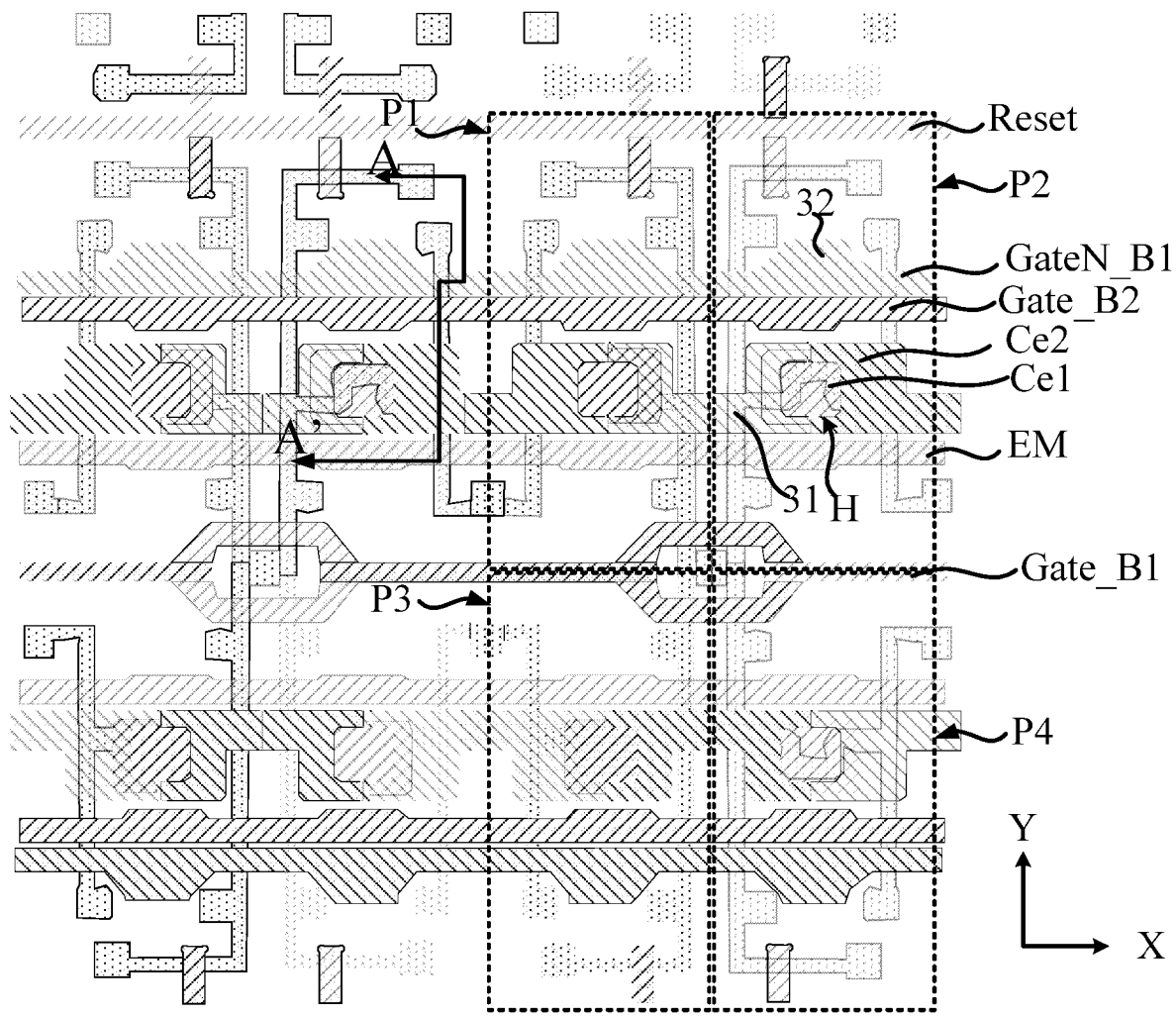
FIG. 8a is a schematic diagram of a display substrate obtained after a pattern of a second conductive layer is formed according to an embodiment of the present disclosure.
Figure 8B:
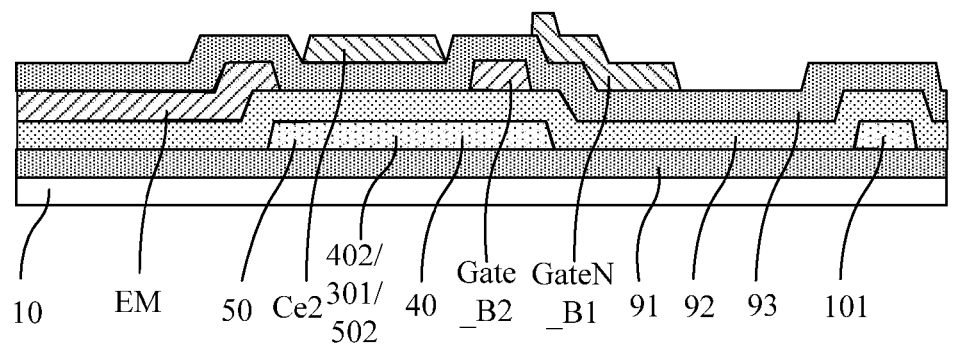

(13) A pattern of a second conductive layer is formed. In some exemplary implementations, the forming the pattern of the second conductive layer may include: a third insulating thin film and a second metal thin film are deposited sequentially on the substrate on which the afore-mentioned pattern is formed, and the second metal thin film is patterned by a patterning process to form a third insulating layer 93 covering the first conductive layer and a pattern of a second conductive layer disposed on the third insulating layer 93. The pattern of the second conductive layer at least includes a second electrode plate Ce2 of the storage capacitor and a first branch GateN_B1 of the second scan signal line GateN, as shown in FIGS. 8a and 8b, and FIG. 8b is sectional view taken along a direction A-A' in FIG.

8a. In some exemplary implementations, the second conductive layer may be referred to as a second gate metal (GATE 2) layer.

In some exemplary implementations, second conductive layers of any two adjacent columns of sub-pixels are of an image symmetrical structure in the second direction Y, and second conductive layers of any two adjacent rows of sub-pixels are of an image symmetrical structure in the first direction X.

In some exemplary implementations, the first branch GateN_B1 of the second scan signal line GateN extends in the first direction X. In each sub-pixel, the second electrode plate Ce2 of the storage capacitor is located between the first branch GateN_B1 of the second scan signal line GateN and the light emitting control signal line EM.

In some exemplary implementations, the first branch GateN_B1 of the second scan signal line is provided with a fourth bump 32 in each sub-pixel, and in each sub-pixel, a convex direction of the third bump 23 is opposite to a convex direction of the fourth bump 32. The third bump 23 and the fourth bump 32 may make a subsequently formed eighth active layer 80 flatter.

In some exemplary implementations, a contour of the second electrode plate Ce2 may be rectangle, and corners of the rectangle may be provided with chamfers. There is a region in which an orthographic projection of the second electrode plate Ce2 on the substrate overlaps with the orthographic projection of the first electrode plate Ce1 on the substrate. The second electrode plate 32 is provided with an aperture H, and the aperture H may be located in the middle of the second electrode plate Ce2. The aperture H may be in a shape of a regular hexagon, so that the second electrode plate Ce2 is in an annular structure. The aperture H exposes the third insulating layer covering the first electrode plate Ce1, and the orthographic projection of the first electrode plate Ce1 on the substrate contains an orthographic projection of the aperture H on the substrate. In some exemplary implementations, the aperture H is arranged to accommodate a fourth via that is subsequently formed. The fourth via is located in the aperture H and exposes the first electrode plate Ce1, so that the second electrode of the eighth transistor T8 that is subsequently formed is connected with the first electrode plate Ce1.

In some exemplary implementations, the second conductive layer may further include an electrode plate connect line 31 that is disposed between second electrode plates Ce2 of adjacent sub-pixels in the first direction X, a first end of the electrode plate connect line 31 is connected with the second electrode plate Ce2 of this sub-pixel, and a second end of the electrode plate connect line 31 extends in the first direction X or a direction opposite to the first direction X to connect with a second electrode plates Ce2 of an adjacent sub-pixel, that is, the electrode plate connect line 31 is configured to allow the second electrode plates of the adjacent sub-pixels to be connected with each other in the first direction X. In some exemplary implementations, second electrode plates in a sub-pixel row are connected with each other through the electrode plate connect line 31 to form an integrated structure, and the second electrode plates in the integrated structure may be shared as power supply signal lines, which makes sure that a plurality of second electrode plates in a sub-pixel row have a same potential, which is beneficial to improving uniformity of the panel and avoiding a poor display of the display substrate, thereby ensuring a display effect of the display substrate.

After this process, the display substrate includes the first insulate layer 91 disposed on the substrate, the first semiconductor layer disposed on the first insulate layer 91, the second insulating layer 92 covering the first semiconductor layer, the first conductive layer disposed on the second insulating layer 92, the third insulating layer 93 covering the first conductive layer and the second conductive layer disposed on the third insulating layer 93. The second conductive layer at least includes the second electrode plate Ce2 of the storage capacitor and the first branch GateN_B1 of the second scan signal line GateN.

(14) A pattern of a second semiconductor layer is formed. In some exemplary implementations, the forming the pattern of the second semiconductor layer may include: a fourth insulating thin film and a second semiconductor thin film are sequentially deposited on the substrate on which the afore-mentioned patterns are formed, and the second semiconductor thin film is patterned by a patterning process to form a fourth insulating layer 94 covering the substrate and a second semiconductor layer disposed on the fourth insulating layer 94, as shown in FIGS. 9a and 9b, wherein FIG. 9b is a sectional view taken along an A-A' direction in FIG. 9a.

In some exemplary implementations, second semiconductor layers of any two adjacent columns of sub-pixels are of an image symmetrical structure in the second direction Y, and second semiconductor layers of any two adjacent rows of sub-pixels are of an image symmetrical structure in the first direction X.

Figure 9A:
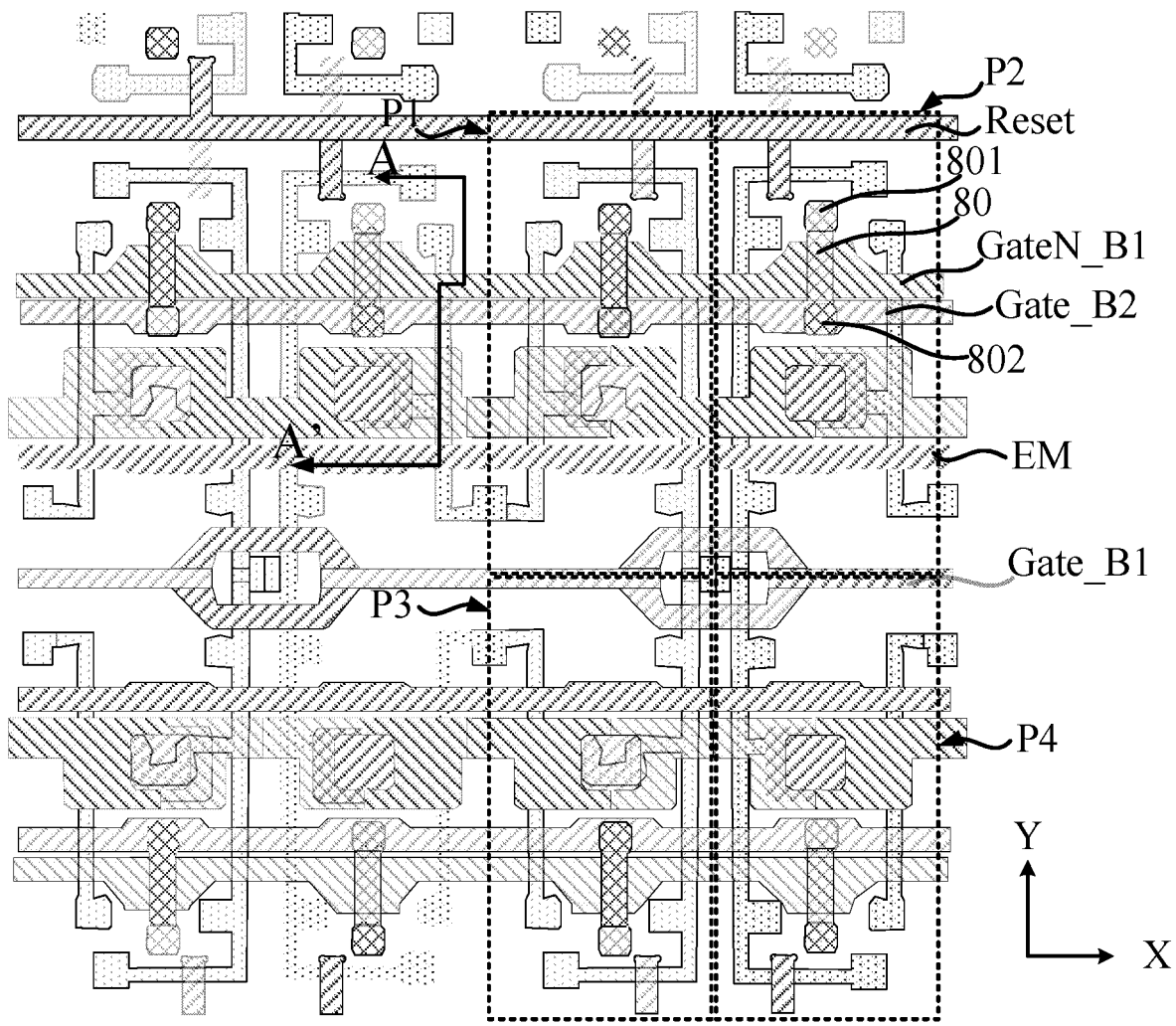
FIG. 9a is a schematic diagram of a display substrate obtained after a pattern of a second semiconductor layer is formed according to an embodiment of the present disclosure.
Figure 9B:
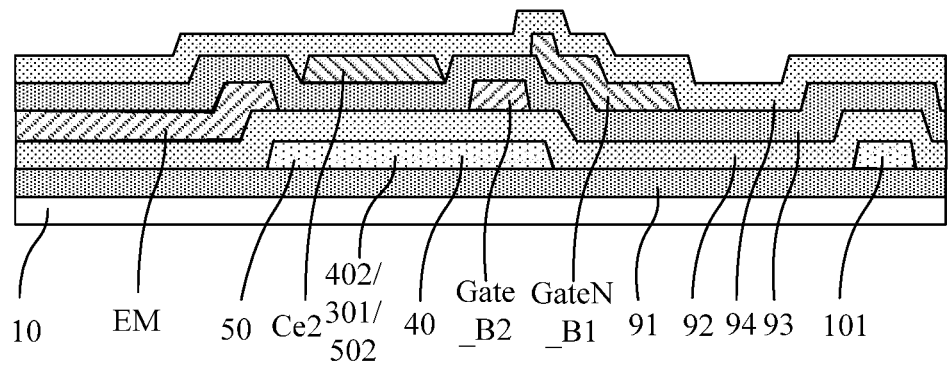

As shown in FIG. 9a, the second semiconductor layer of each sub-pixel may include an eighth active layer 80 of an eighth transistor T8. In some exemplary implementations, the eighth active layer 80 extends in the second direction Y and may be of a dumbbell shape.

In some exemplary implementations, a first region 801 of the eighth active layer 80 is adjacent to a first active layer of the first transistor T1, and a second region 802 of the eighth active layer 80 is adjacent to the first capacitor C1.

In some exemplary implementations, an orthographic projection of the eighth active layer 80 on the substrate overlaps with orthographic projections of the third bump 23 and the fourth bump 32 on the substrate.

In some exemplary implementations, oxide may be used for the second semiconductor layer, that is, the eighth transistor is an oxide thin film transistor.

After this process, the display substrate includes the first insulating layer 91 disposed on the substrate, the first semiconductor layer disposed on the first insulating layer 91, the second insulating layer 92 covering the first semiconductor layer, the first conductive layer disposed on the second insulating layer 92, the third insulating layer 93 covering the first conductive layer, the second conductive layer disposed on the third insulating layer 93, the fourth insulating layer 94 covering the second conductive layer and the second semiconductor layer disposed on the fourth insulating layer 94. The second semiconductor layer includes at least the eighth active layer 80.

Figure 10A:
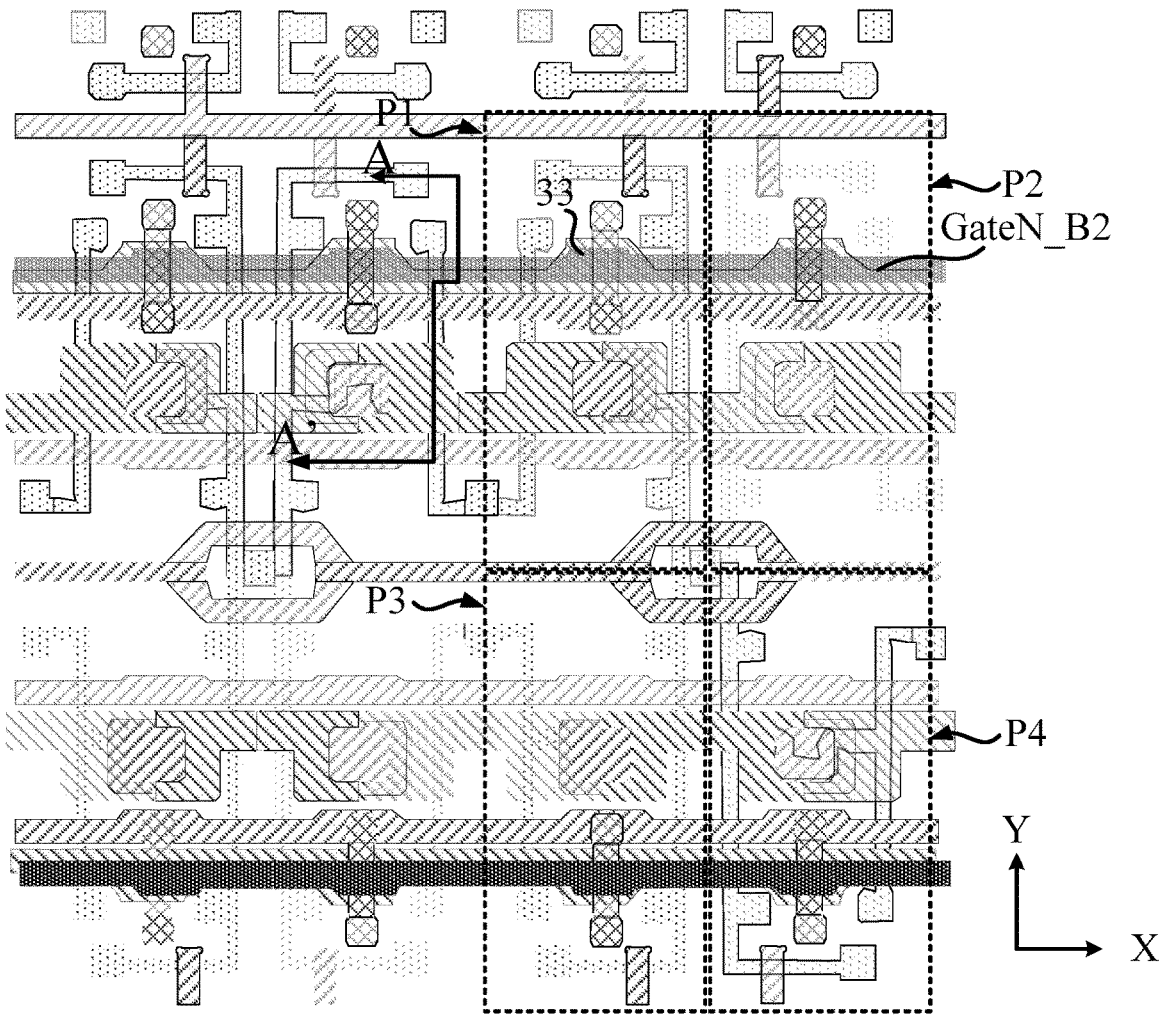
FIG. 10a is a schematic diagram of a display substrate obtained after a pattern of a third conductive layer is formed according to an embodiment of the present disclosure.
Figure 10B:
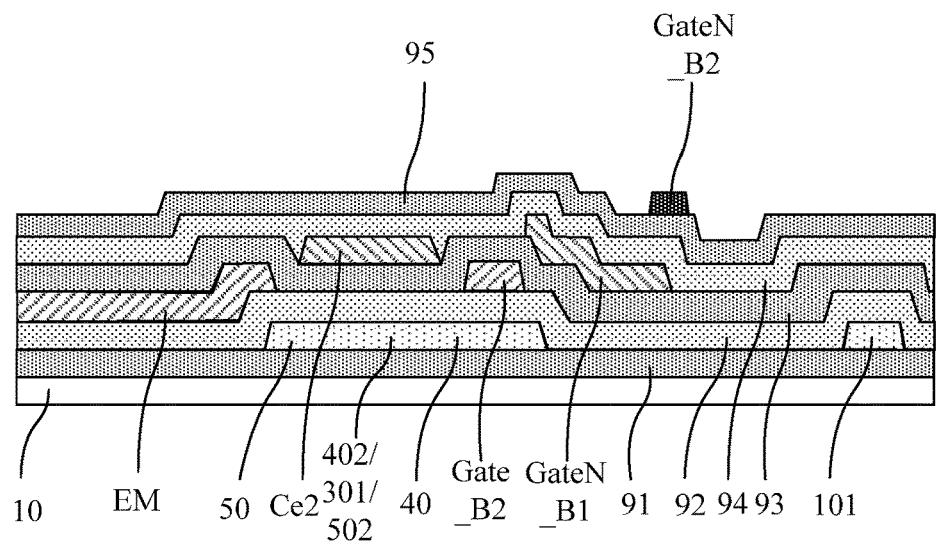

(15) A pattern of a third conductive layer is formed. In some exemplary implementations, forming the pattern of the third conductive layer may include: a fifth insulating thin film and a third metal thin film are sequentially deposited on the substrate on which the afore-mentioned patterns are formed, and the fifth insulating thin film and the third metal thin film are patterned, respectively, by a patterning process to form a fifth insulating layer 95 disposed on the second semiconductor layer and a pattern of a third conductive layer disposed on the fifth insulating layer 95. The pattern of the third conductive layer at least include the second branch GateN_B2 of the second scan signal line GateN, as shown in FIGS. 10a and 10b, and FIG. 10b is a sectional view taken in an A-A' direction in FIG. 10a. In some exemplary implementations, the third conductive layer may be referred to as a third gate metal (GATE3) layer.

In some exemplary implementations, third conductive layers of any two adjacent columns of sub-pixels are of an image symmetrical structure in the second direction Y, and third conductive layers of any two adjacent rows of sub-pixels are of an image symmetrical structure in the first direction X.

In some exemplary implementations, the second branch GateN_B2 of the second scan signal line GateN extends in the first direction X, and the second branch GateN_B2 of the second scan signal line GateN is adjacent to the second branch Gate_B2 of the first scan signal line Gate. In some exemplary implementations, a region in which the second scan signal line GateN_B2 of the second scan signal line GateN overlaps with the eighth active layer 80 serves as a gate of the eighth transistor.

In some exemplary embodiments, the second branch GateN_B2 of the second scan signal line is provided with a fifth bump 33, and in each sub-pixel, a convex direction of the fifth bump 33 is the same as the convex direction of the fourth bump 32.

In some exemplary implementations, the orthographic projection of the second branch GateN_B2 of the second scan signal line on the substrate overlaps with the orthographic projection of the first branch GateN_B1 of the second scan signal line on the substrate. In some exemplary implementations, the first branch GateN_B1 of the second scan signal line and the second branch GateN_B2 of the second scan signal line may be connected by a signal line in a peripheral area.

After this process, the display substrate includes the first insulating layer 91 disposed on the substrate, the first semiconductor layer disposed on the first insulating layer 91, the second insulating layer 92 covering the first semiconductor layer, the first conductive layer disposed on the second insulating layer 92, the third insulating layer 93 covering the first conductive layer, the second conductive layer disposed on the third insulating layer 93, the fourth insulating layer 94 covering the second conductive layer and the second semiconductor layer disposed on the fourth insulating layer 94, the fifth insulating layer 95 covering the second semiconductor layer and the third conductive layer disposed on the fifth insulating layer 95. The third conductive layer at least includes the second branch GateN_B2 of the second scan signal line GateN.

Figure 11A:
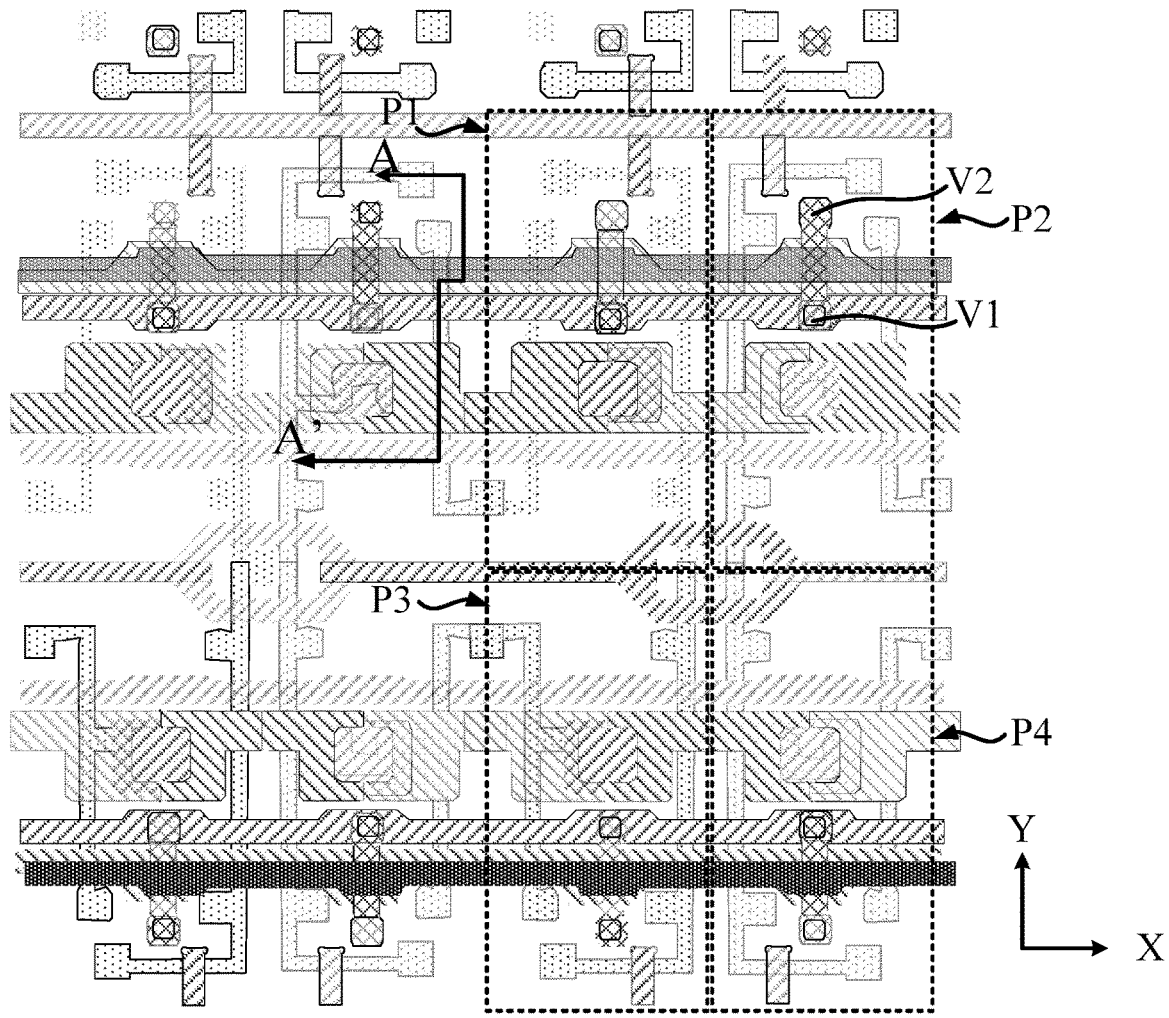
FIG. 11a is a schematic diagram of a display substrate obtained after a pattern of oxide vias is formed according to an embodiment of the present disclosure.
Figure 11B:
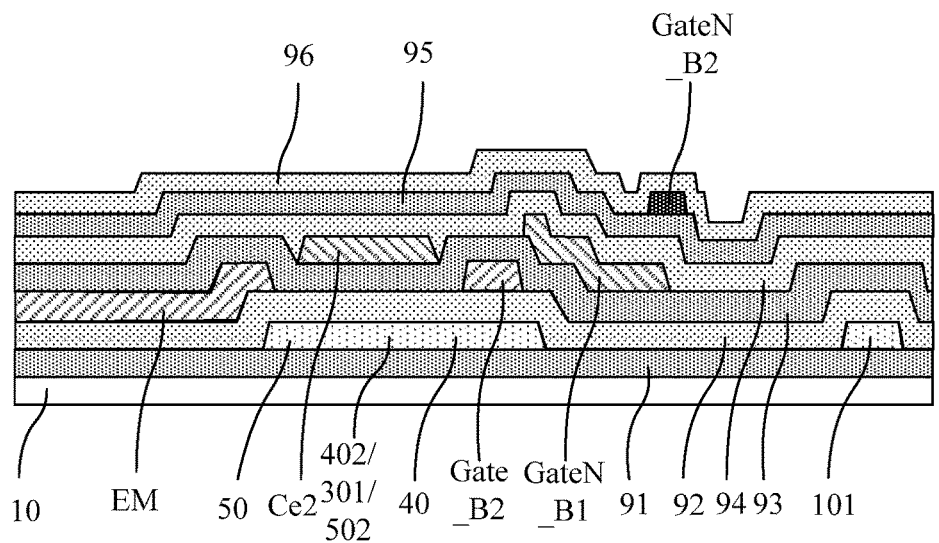

(16) A pattern of oxide vias is formed. In some exemplary implementations, forming the oxide vias may include: a sixth insulate thin film is deposited on the substrate on which the afore-mentioned patterns are formed, the sixth insulating thin film is patterned by a patterning process to form a sixth insulating layer 96 covering the third conductive layer, a plurality of vias are disposed on the sixth insulating layer 96, and the plurality of vias at least include: the first via V1 and the second via V2, as shown in FIGS. 11a and 11b, and FIG. 11b is a sectional view taken along a direction A-A' in FIG. 11a.

In some exemplary implementations, oxide vias of any two adjacent columns of sub-pixels are of an image symmetrical structure in the second direction Y, and oxide vias of any two adjacent rows of sub-pixels are of an image symmetrical structure in the first direction X.

In some exemplary implementations, the sixth insulating layer and the fifth insulate layer in the first via V1 are etched off to expose a surface of the second region of the eighth active layer 80.

In some exemplary implementations, the sixth insulating layer and the fifth insulating layer in the second via V2 are etched off to expose a surface of the first region of the eighth active layer 80.

Figure 12A:
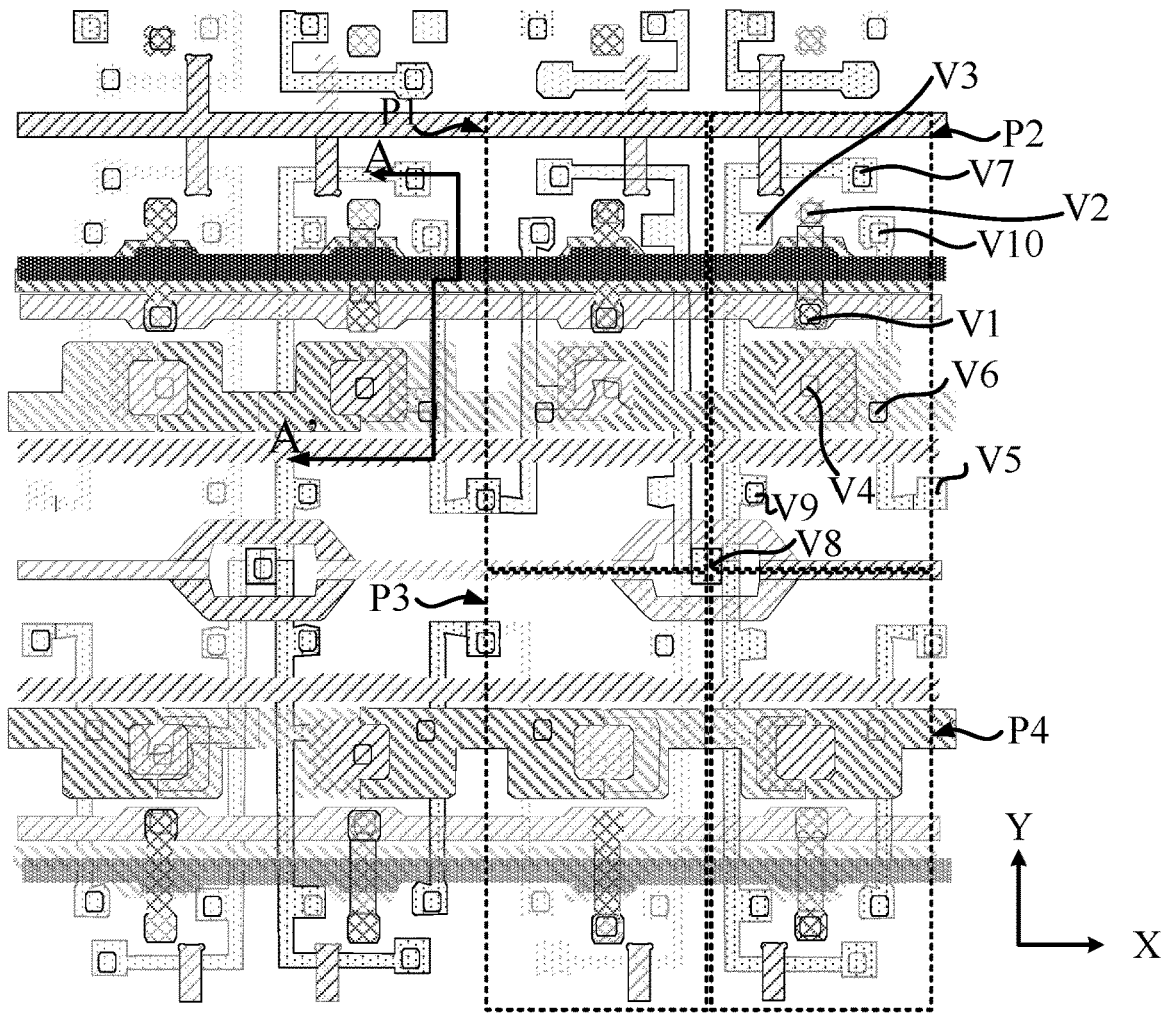
FIG. 12a is a schematic diagram of a display substrate obtained after a pattern of poly silicon vias is formed according to an embodiment of the present disclosure.
Figure 12B:
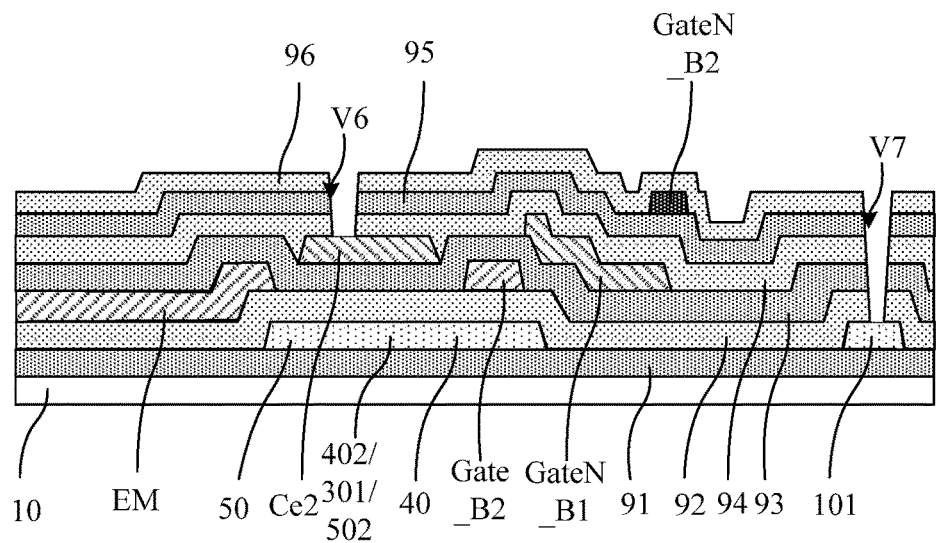

(17) A pattern of poly silicon vias is formed. In some exemplary implementations, forming the pattern of poly silicon vias may include: a plurality of vias are formed on the substrate, on which the above-mentioned patterns are formed, by a patterning process. The plurality of vias at least include: a third via V3, a fourth via V4, a fifth via V5, a sixth via V6, a seventh via V7, an eighth via V8, a ninth via V9 and a tenth via V10, as shown in FIGS. 12a and 12b, and FIG. 12b is a sectional view taken along a direction A-A' in FIG. 12a.

In some exemplary implementations, poly silicon vias of any two adjacent columns of sub-pixels are of an image symmetrical structure in the second direction Y, and poly silicon vias of any two adjacent rows of sub-pixels are of an image symmetrical structure in the first direction X.

In some exemplary implementations, the sixth insulating layer, the fifth insulating layer, the fourth insulating layer, the third insulating layer, and the second insulating layer in the third via V3 are etched off to expose the surface of the first region of the second active layer (i.e., the second region of the first active layer). The third via V3 is arranged such that the first electrode of the second transistor T2 subsequently formed is connected to the second active layer through the via V3 and the second electrode of the first transistor T1 subsequently formed is connected to the first active layer through the via V3.

In some exemplary implementations, the fourth via V4 is located in the aperture H of the second electrode plate Ce2, and an orthographic projection of the fourth via V4 on the substrate is in a range of the orthographic projection of the aperture H on the substrate. A sixth insulating layer, a fifth insulating layer, a fourth insulating layer and a third insulating layer in the fourth via V4 are etched off to expose a surface of the first electrode plate Ce1. The fourth via V4 is arranged such that the third connection electrode 43 formed subsequently is connected with the first electrode plate Ce1 through this via V4.

In some exemplary implementations, the sixth insulating layer, the fifth insulating layer, the fourth insulating layer, the third insulating layer, and the second insulating layer in the fifth via V5 are etched off to expose the surface of the first region of the fifth active layer. The fifth via V5 is arranged such that a first electrode of the fifth transistor T5 subsequently formed is connected to the fifth active layer through the via V5.

In some exemplary implementations, the sixth via V6 is located in a region in which the second electrode plate Ce2 is located. An orthographic projection of the sixth via V6 on the substrate is within a range of the orthographic projection of the second electrode plate Ce2 on the substrate. The sixth insulating layer, the fifth insulating layer and the fourth insulating layer in the sixth via V6 are etched off to expose a surface of the second electrode plate Ce2. The sixth via V6 is arranged such that the fifth connection electrode 45 formed subsequently is connected with the second electrode plate Ce2 through this via V6.

In some exemplary implementations, the sixth insulating layer, the fifth insulating layer, the fourth insulating layer, the third insulating layer, and the second insulating layer in the seventh via V7 are etched off to expose the surface of the first region of the first active layer. The seventh via V7 is arranged such that a first electrode of the first transistor T1 subsequently formed is connected with the first active layer through this via V7.

In some exemplary implementations, an eighth via V8 is disposed at the center of each Repetitive Unit (RU). An orthographic projection of the first aperture on the substrate covers an orthographic projection of the eighth via on the substrate. The sixth insulating layer, the fifth insulating layer, the fourth insulating layer, the third insulating layer, and the second insulating layer in the eighth via V8 are etched off to expose the surface of the first region of the seventh active layer. The eighth via V8 is arranged such that the first initial signal line formed subsequently is connected with the seventh active layer through this via V8.

In some exemplary implementations, the sixth insulating layer, the fifth insulating layer, the fourth insulating layer, the third insulating layer, and the second insulating layer in the ninth via V9 are etched off to expose the surface of the second region of the sixth active layer (i.e., the second region of the seventh active layer). The ninth via V9 is arranged such that a second electrode of the sixth transistor T6 subsequently formed is connected with the sixth active layer through the via V9 and a second electrode of the seventh transistor T7 subsequently formed is connected with the seventh active layer through the via V9.

In some exemplary implementations, the sixth insulating layer, the fifth insulate layer, the fourth insulating layer, the third insulating layer, and the second insulating layer in the tenth via V10 are etched off to expose the surface of the first region of the fourth active layer. The tenth via V10 is arranged such that the second connection electrode 42 formed subsequently is connected with the fourth active layer through this via V10.

Figure 13A:
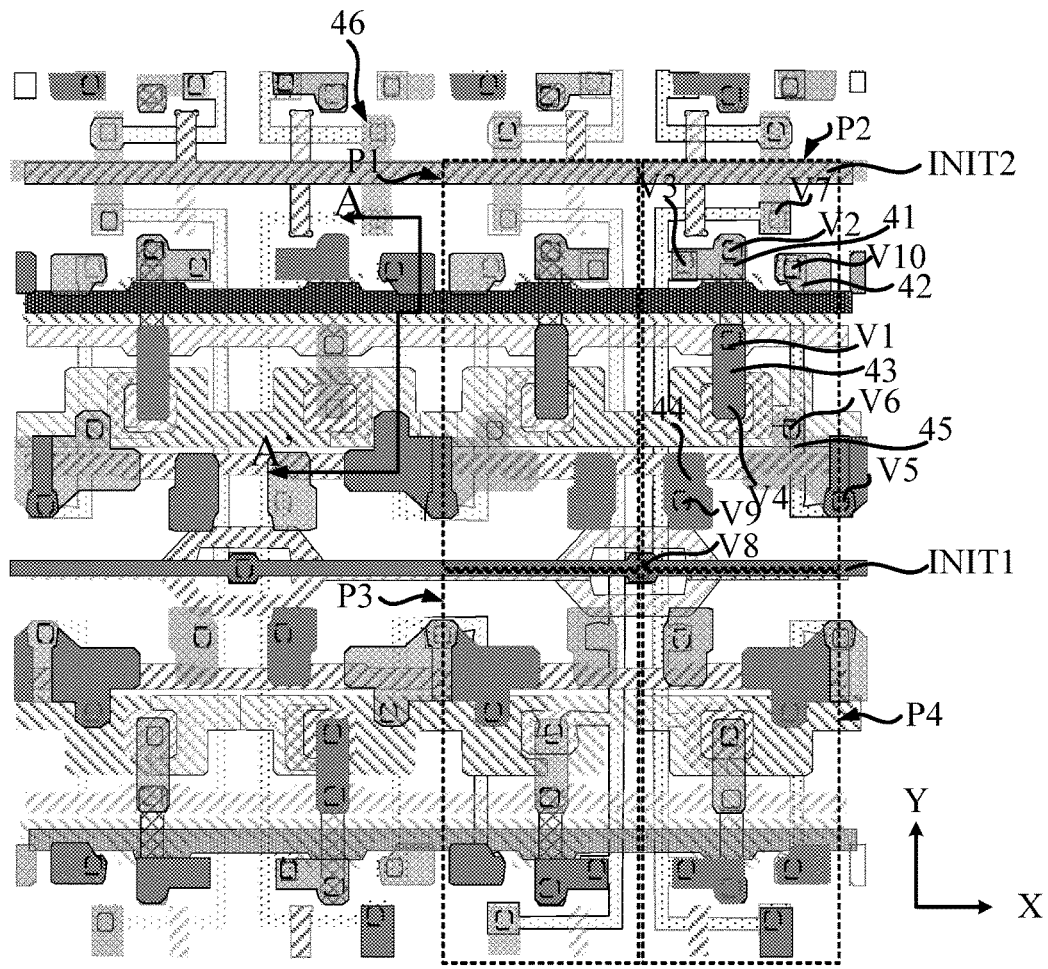
FIG. 13a is a schematic diagram of a display substrate obtained after a pattern of a fourth conductive layer is formed according to an embodiment of the present disclosure.
Figure 13B:
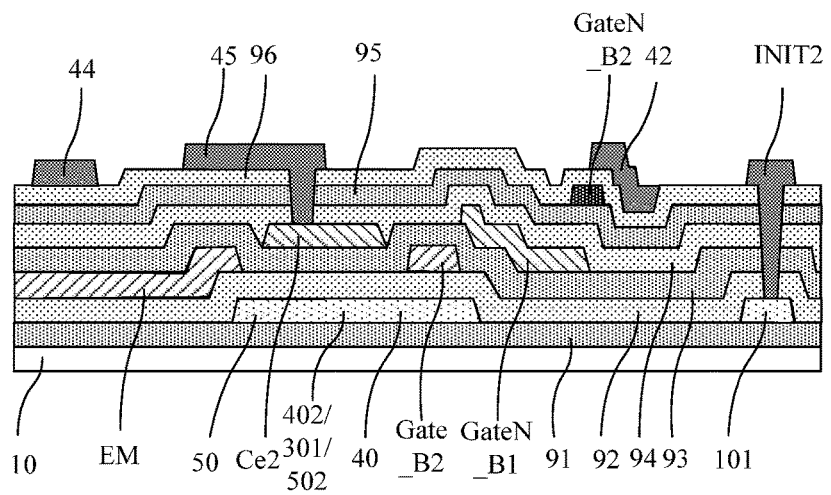

(18) A pattern of a fourth conductive layer is formed. In some exemplary implementations, forming the pattern of the fourth conductive layer may include: a fourth metal thin film is deposited on the substrate on which the afore-mentioned patterns are formed, and the fourth metal thin film is patterned by a patterning process to form a fourth conductive layer disposed on the sixth insulating layer. The fourth conductive layer at least includes a first initial signal line INIT1, a second initial signal line INIT2, a first connection electrode 41, a second connection electrode 42, a third connection electrode 43, a fourth connection electrode 44 and a fifth connection electrode 45, as shown in FIGS. 13a and 13b, wherein FIG. 13b is a sectional view taken along an A-A' direction in FIG. 13a. In some exemplary implementations, the fourth conductive layer may be referred to as a first source drain metal (SD1) layer.

In some exemplary implementations, fourth conductive layers of any two adjacent columns of sub-pixels are of an image symmetrical structure in the second direction Y, and fourth conductive layers of any two adjacent rows of sub-pixels are of an image symmetrical structure in the first direction X.

In some exemplary implementations, the first initial signal line INIT1 and the second initial signal line INIT2 extend in the first direction X, the first initial signal line INIT1 is connected with the first region of a seventh active layer through the eighth via V8, so that the first electrode of a seventh transistor T7 has a same potential as the first initial signal line INIT1.

In some exemplary implementations, the first initial signal line INIT1 is disposed at the center of a row of Repetitive Units (RUs) in the first direction X.

In some exemplary implementations, the second initial signal line INIT2 is disposed between two adjacent rows of Repetitive Units (RUs).

In some exemplary implementations, the second initial signal line (INIT2) is provided with a second bump 46 extending in the second direction Y or the direction opposite to the second direction Y, the orthographic projection of the second bump 46 on the substrate covers an orthographic projection of the seventh via V7 on the substrate, and a plurality of second bumps 46 are connected to first regions of the first active layers in the first sub-pixel, the second sub-pixel, the third sub-pixel and the fourth sub-pixel through the seventh via V7. The second bump 46 may serve as a first electrode of the first transistor T1 such that the first electrode of the first transistor T1 has the same potential as the second initial signal line INIT2.

In some exemplary implementations, an orthographic projection of the second initial signal line INIT2 on the substrate overlaps with an orthographic projection of the reset control signal line Reset on the substrate.

In this embodiment, generally, the material of the fourth conductive layer is a titanium aluminum titanium alloy, the material of the first conductive layer to the material of the third conductive layer is metal molybdenum (Mo), and the resistance of the titanium aluminum titanium alloy is smaller than the metal molybdenum (Mo). Therefore, by disposing the first initial signal line INIT1 and the second initial signal line INIT2 on the fourth conductive layer, a load on the signal line (RC loading) is reduced.

In some exemplary implementations, the first connection electrode 41 may be in an "L" shape, one terminal of which is connected with a first region of the second active layer (i.e., a second region of the first active layer) through the third via V3, and the other terminal of which is connected with a first region of the eighth active layer through the second via V2. In some exemplary implementations, the first connection electrode 41 may serve as the first electrode of the eighth transistor T8, the first electrode of the second transistor and the second electrode of the first transistor.

In some exemplary implementations, the second connection electrode 42 may be in an "L" shape, the second connection electrode 42 is connected with the first region of the fourth active layer through a tenth via V10 on one hand, and the second connection electrode 42 is connected with a subsequently formed data signal line through a subsequently formed thirteenth via V13 on the other hand. In some exemplary implementations, the second connection electrode 42 may serve as the first electrode of the fourth transistor T4.

In some exemplary implementations, the third connection electrode 43 may be in a triangular shape, one terminal of which is connected with a second region of the eighth active layer through the first via V1, and another terminal of which is connected with a first electrode plate Ce1 through the fourth via V4. In some exemplary implementations, the third connection electrode 43 may serve as the second electrode of the eighth transistor T8.

In some exemplary implementations, the fourth connection electrode 44 is connected with the second region of the sixth active layer (i.e., the second region of the seventh active layer) through the ninth via V9 on the one hand, and is connected with a subsequently formed anodic connection electrode through a subsequently formed eleventh via V11 on the other hand. In some exemplary implementations, the fourth connection electrode 44 may serve as the second electrode of the sixth transistor T6 and the second electrode of the seventh transistor T7.

In some exemplary implementations, on one hand, a zigzag-shaped fifth connection electrode 45 (the power supply connection electrode) is connected with the second electrode plate Ce2 through the sixth via V6; on the other hand, the zigzag-shaped fifth connection electrode 45 is connected with the first region of the fifth active layer through the fifth via V5, and the fifth connection electrode 45 is configured to connect with a subsequently formed first power supply line VDD through a subsequently formed twelfth via V12.

In some exemplary implementations, the fifth connection electrodes 45 in two adjacent repetitive units in the first direction X may be connected to form an integrated structure.

Figure 14A:
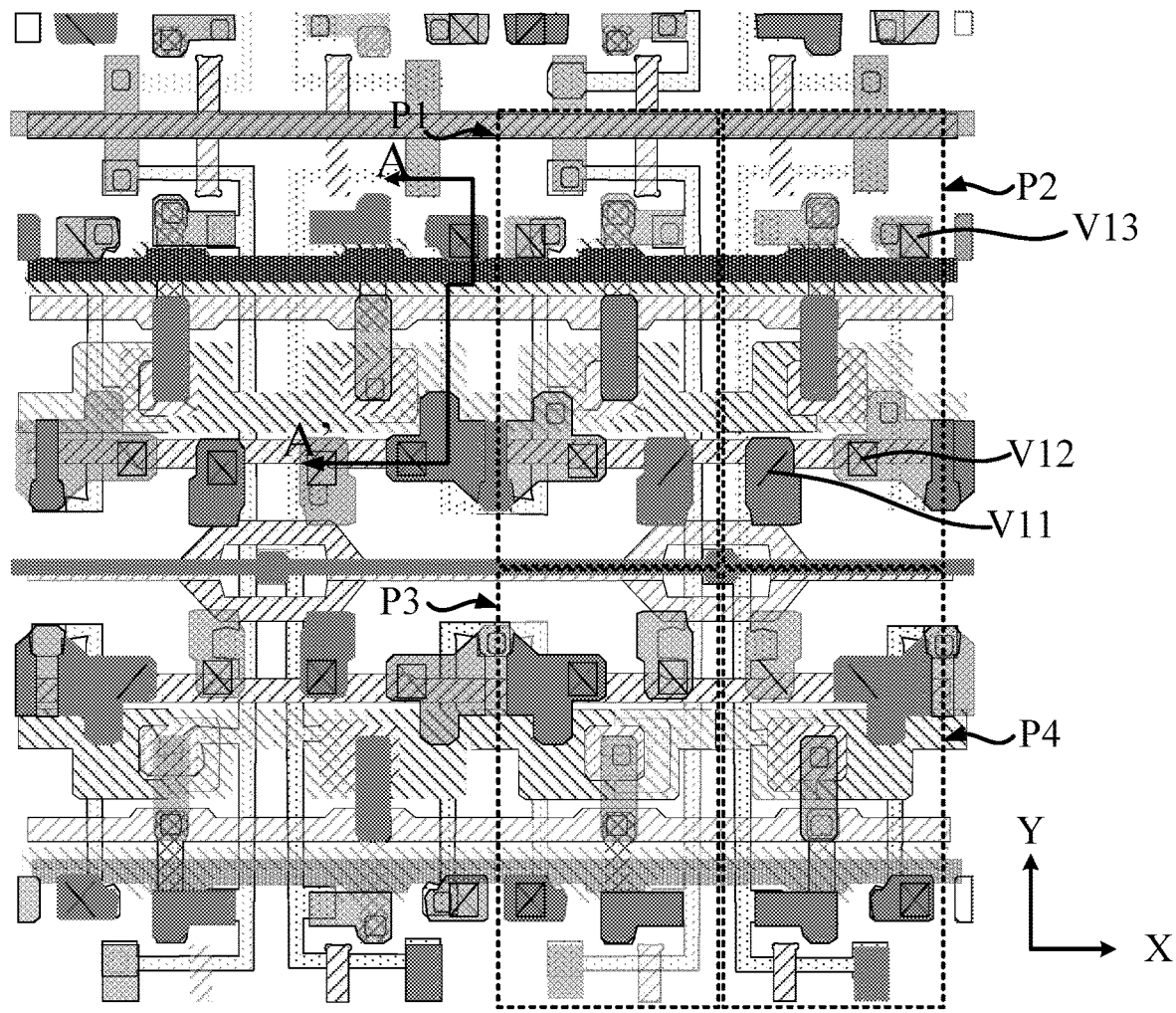
FIG. 14a is a schematic diagram of a display substrate after a pattern of a first planarization layer is formed according to an embodiment of the present disclosure.
Figure 14B:
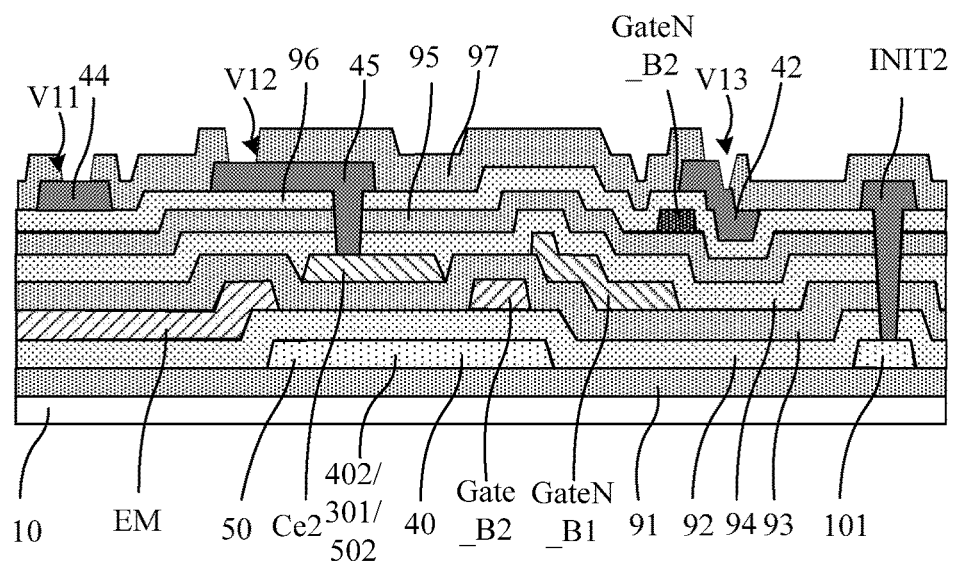
Figure 15A:
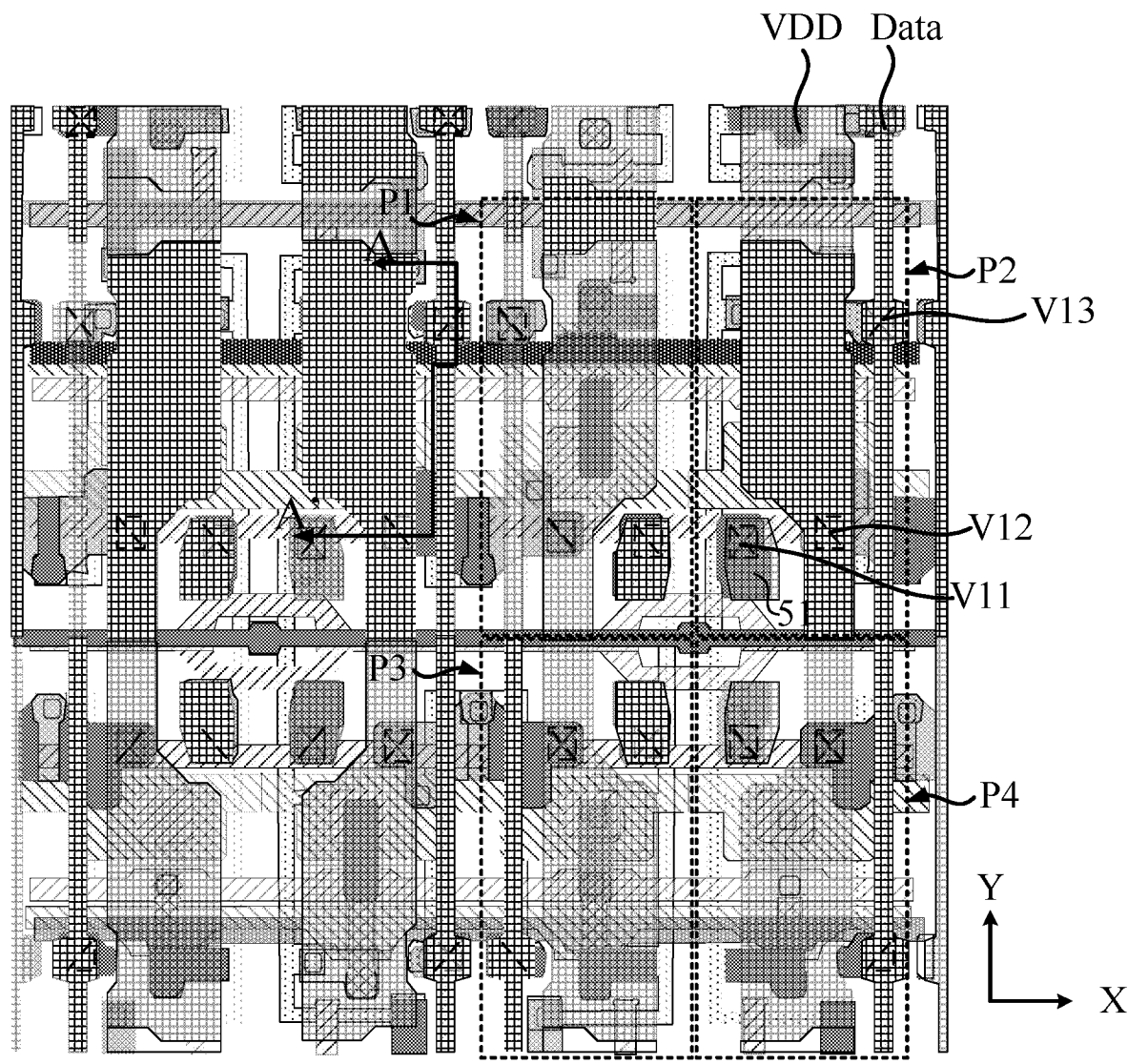
FIG. 15a is a schematic diagram of a display substrate obtained after a pattern of a fifth conductive layer is formed according to an embodiment of the present disclosure.
Figure 15B:
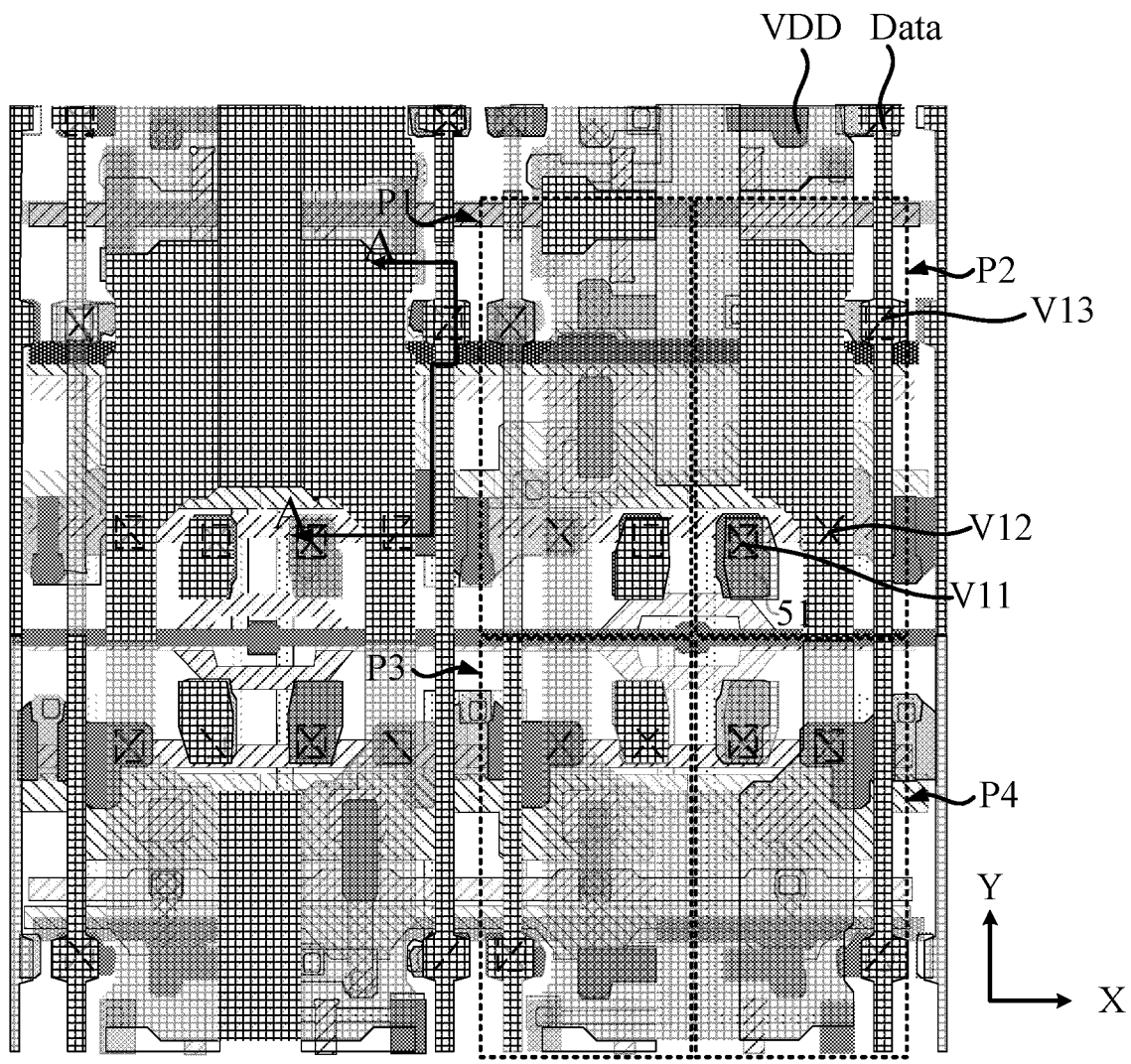
FIG. 15b is a schematic diagram of another display substrate obtained after a pattern of a fifth conductive layer is formed according to an embodiment of the present disclosure.
Figure 15C:
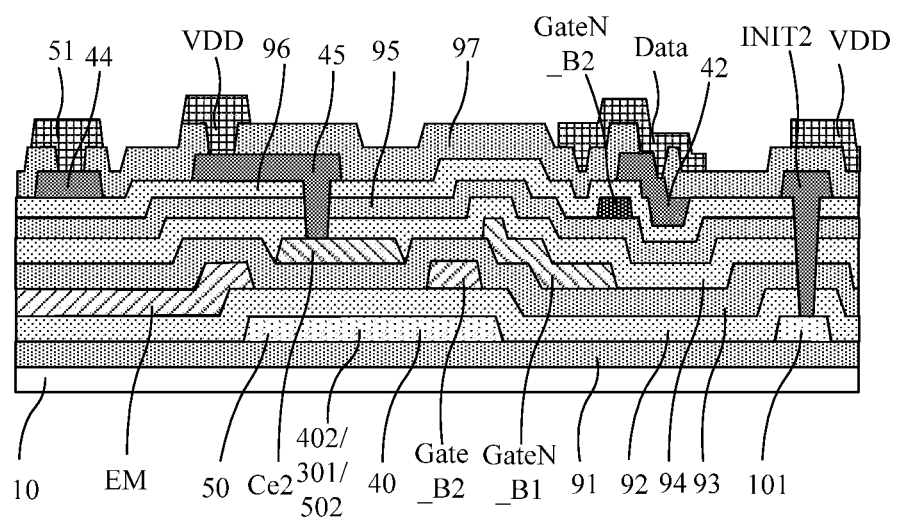

(19) Patterns of a first planarization layer 97 and a fifth conductive layer are formed. In some exemplary implementations, forming the fifth conductive layer may include: on the substrate on which afore-mentioned patterns are formed, a first planarization thin film and a fifth metal thin film are deposited sequentially, the first planarization film and the fifth metal film are patterned by a patterning process, to form a first planarization layer disposed on the fourth conductive layer and a pattern of a fifth conductive layer disposed on the first planarization layer. The first planarization layer 97 at least includes an eleventh via V11, a twelfth via V12, and a thirteenth via 13, as shown in FIGS. 14a and 14b. The fifth conductive layer at least includes a data signal line Data, a first power supply line VDD, and an anode connection electrode 51, as shown in FIGS. 15a, 15b and 15c. In some exemplary implementations, the fifth conductive layer may be referred to as a second source drain metal (SD2) layer.

In some exemplary implementations, fifth conductive layers of any two adjacent columns of sub-pixels are of an image symmetrical structure in the second direction Y, and fifth conductive layers of any two adjacent rows of sub-pixels are of an image symmetrical structure in the first direction X.

In some exemplary implementations as shown in FIG. 15a, within a repetitive unit, the first power supply lines VDD in two adjacent columns of sub-pixels may be separated from each other.

In some exemplary implementations as shown in FIG. 15b, within a repetitive unit, the first power supply lines VDD in two adjacent columns of sub-pixels may be connected with each other to form an integrated structure. By forming the integral structure in which the first power supply lines VDD in two adjacent rows of sub-pixels are connected to each other, the anode formed in the upper layer can be made flatter.

In some exemplary implementations, the anode connection electrode 51 may be of a shape of a rectangle and is connected with the fourth connection electrode 44 through the eleventh via V11.

In some exemplary implementations, the orthographic projection of the first branch Gate_B1 of the first scan signal line on the substrate overlaps with the orthographic projection of the anode connection electrode 51 on the substrate.

In some exemplary implementations, the first power supply line VDD is connected with the fifth connection electrode 45 through the twelfth via V12.

In some exemplary implementations, the data signal line Data extends in the second direction Y, the data signal line Data is connected with the second connection electrode 42 through the thirteenth via V13, and because the second connection electrode 42 is connected with the first region of the fourth active layer through the tenth via V10, a connection between the data signal line and the first electrode of the fourth transistor is achieved, so that the data signal transmitted by the data signal line Data can be written into the fourth transistor.

(20) A pattern of a second planarization layer is formed. In some exemplary implementations, forming the pattern of the second planarization layer may include: a second planarization thin film is coated on the substrate on which afore-mentioned patterns are formed, and the second planarization thin film is patterned by a patterning process to form the second planarization layer 98 that covers the fifth conductive layer. The second planarization layer 98 is at least provided with a fourteenth via V14, as shown in FIGS. 5a and 5b.

In some exemplary implementations, the fourteenth via V14 is located in a region where the anode connection electrode 51 is located. The second planarization layer in the fourteenth via V14 is removed to expose a surface of the anode connection electrode 51. The fourteenth via V14 is configured such that the anode to be formed subsequently is connected to the anode connection electrode 51 through the via V14.

(21) A pattern of an anode is formed. In some exemplary implementations, forming a pattern of an anode may include: a transparent conductive thin film is deposited on the substrate on which the above-mentioned patterns are formed, and the transparent conductive thin film is patterned by a patterning process to form an anode disposed on the second planarization layer.

In some exemplary implementations, the anode is connected with the anode connection electrode 51 through the fourteenth via V14. Because the anode connection electrode 51 is connected with the fourth connection electrode 44 through the eleventh via V11, and the fourth connection electrode 44 is also connected with the second region of the sixth active layer (i.e., the second region of the seventh active layer) through the ninth via V9, it is achieved that the pixel circuit can drive the light emitting element to emit light.

In some exemplary implementations, a subsequent manufacturing process may include: a pixel defining thin film is coated, and the pixel defining thin film is patterned by a patterning process to form a Pixel Defining Layer (PDL). A pixel defining layer of each subpixel is provided with a Subpixel Aperture (SA) exposing the anode. An organic light emitting layer is formed using an evaporation or ink-jet printing process, and a cathode is formed on the organic light emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is disposed between the first encapsulation layer and the third encapsulation layer, so that it may be ensured that external water vapor cannot enter a light emitting structure layer.

In some exemplary implementations, the substrate may be a flexible substrate or a rigid substrate. The rigid substrate may be made of, but is not limited to, one or more of glass and quartz. The flexible substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some exemplary implementations, the flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a surface-treated polymer soft film, or the like; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In some exemplary implementations, the first conductive layer, the second conductive layer, the third conductive layer, fourth conductive layer and the fifth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be of a single-layer structure or a multi-layer composite structure, such as Mo/Cu/Mo, etc. The first insulate layer, the second insulate layer, the third insulate layer, the fourth insulate layer, the fifth insulate layer, and the sixth insulate layer may be made of any one or more of Silicon Oxide (SiOx), Silicon Nitride (SiNx), and Silicon OxyNitride (SiON), and may be a single layer, a multi-layer, or a composite layer. The first insulating layer is referred to as a buffer (BUF) layer, which is used to improve the water and oxygen resistance of the substrate, the second insulating layer is referred to as a first gate insulating (GI1) layer, and the third insulating layer is referred to as a second gate insulating (GI2) layer, the fourth insulating layer is referred to as a first interlayer insulating (ILD1) layer, the fifth insulating layer is referred to as a second interlayer insulating (ILD2) layer, and the sixth insulating layer is referred to as a passivation (PVX) layer. The first planarization (PLN1) layer and the second planarization (PLN2) layer may be made of an organic material, and the transparent conductive thin film may be made of Indium Tin Oxide (ITO) or Indium Zinc Oxide (IZO). The first semiconductor (SML1) layer may be made of poly silicon (p-Si) and the second semiconductor (SML2) layer may be made of an oxide.

In the display substrate according to the embodiment of the present disclosure, a plurality of sub-pixels in the image symmetrical structure in the first direction X and the second direction Y, which is beneficial to saving pixel layout space and achieves high resolution on the one hand, and can increase the proportion of non-metallic line areas to the overall area and improve the transmittance of the light ray, on the other hand.

The structure of the display substrate and its manufacturing process in the present disclosure are only exemplary description. In some exemplary implementations, variation of corresponding structures and addition or reduction of the patterning process may be performed as practically required, which is not limited in the present disclosure. The structure of the display substrate shown in the present disclosure and the manufacturing process thereof are described by taking the 8T1C pixel circuit shown in FIG. 3 as an example. In other exemplary implementations, the pixel circuit may alternatively be of a 3T1C, 4T1C, 5T1C, 5T2C, 6T1C or 7T1C structure, which is not limited in the present disclosure.

A method for manufacturing a display substrate is also provided according to the present disclosure. A display substrate according to the previous embodiment is manufactured by the method, and the display substrate includes a plurality of sub-pixels. In some exemplary implementations, the manufacturing process of the display substrate includes the following acts.

A first semiconductor layer, a first conductive layer, a second conductive layer, a second semiconductor layer, a third conductive layer, a fourth conductive layer, and a fifth conductive layer are sequentially formed on a substrate; wherein the first semiconductor layer includes active layers of a plurality of poly silicon transistors, the first conductive layer includes gates of the plurality of poly silicon transistors, a first electrode plate of a storage capacitor and a first scan signal line, the second conductive layer includes a second electrode plate of the storage capacitor, the second semiconductor layer includes active layers of a plurality of oxide transistors, the third conductive layer includes gates of the plurality of oxide transistors, the fourth conductive layer includes first electrodes and second electrodes of the plurality of poly silicon transistors, and first electrodes and second electrodes of the plurality of oxide transistors, and the fifth conductive layer includes a first power supply line and a data signal line, and any two adjacent rows of sub-pixels are symmetrical in an extension direction of the first scan signal line.

Display substrates manufactured by the method for manufacturing the display substrate according to the present disclosure have similar implementation principles and implementation effects to those of the foregoing display substrate, which will not be further repeated here.

The present disclosure further provides a display apparatus which includes the aforementioned display substrate. The display apparatus may be any product or component with a display function, such as a mobile phone, a tablet computer, a television, a display, a notebook computer, a digital photo frame, or a navigator, and the embodiments of the present invention are not limited thereto.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, wherein:
   in a direction perpendicular to the display substrate, the display substrate comprises a first semiconductor layer, a first conductive layer, a second conductive layer, a second semiconductor layer, a third conductive layer, a fourth conductive layer, and a fifth conductive layer that are sequentially disposed on a substrate;
   the first semiconductor layer comprises active layers of a plurality of poly silicon transistors, the first conductive layer comprises gates of the plurality of poly silicon transistors, a first electrode plate of a storage capacitor and a first scan signal line, the second conductive layer comprises a second electrode plate of the storage capacitor, the second semiconductor layer comprises active layers of a plurality of oxide transistors, the third conductive layer comprises gates of the plurality of oxide transistors, the fourth conductive layer comprises first electrodes and second electrodes of the plurality of poly silicon transistors, and first electrodes and second electrodes of the plurality of oxide transistors, and the fifth conductive layer comprises a first power supply line and a data signal line;

in a direction parallel to the display substrate, the display substrate comprises a plurality of sub-pixels, and any two adjacent rows of sub-pixels are symmetrical in an extension direction of the first scan signal line; and first power supply lines in two adjacent columns of sub-pixels are connected with each other to form an integrated structure.

2. The display substrate of claim 1, wherein any two adjacent columns of sub-pixels are symmetrical along an extension direction of the data signal line.

3. The display substrate of claim 2, wherein the first scan signal line comprises a first branch and a second branch, and the fifth conductive layer further comprises an anode connection electrode;

an orthographic projection of the first branch of the first scan signal line on the substrate is overlapped with an orthographic projection of the anode connection electrode on the substrate.

4. The display substrate of claim 1, wherein the fourth conductive layer further comprises a first initial signal line and a second initial signal line; and the plurality of poly silicon transistors comprise a drive transistor, a first reset transistor, and a second reset transistor, and the first reset transistor is configured to reset an anode of a light emitting element through the first initial signal line under control of the first scan signal line; the second reset transistor is configured to reset a gate of the drive transistor through the second initial signal line under control of a reset control signal line.

5. The display substrate of claim 4, wherein the first scan signal line comprises a first branch and a second branch, and an n-th row of sub-pixels and an (n+1)-th row of sub-pixels are symmetrical along the first branch of the first scan signal line, wherein n is a natural number between 1 and N−1, and N is a quantity of a row of sub-pixels;

a first reset transistor in the n-th row of sub-pixels is connected with a first scan signal line in an n-th stage, and a second reset transistor in the n-th row of sub-pixels is connected with a reset control signal line in an (n−1)-th stage;

a first reset transistor in the (n+1)-th row of sub-pixels is connected with the first scan signal line in the n-th stage, and a second reset transistor in the (n+1)-th row of sub-pixels is connected with a reset control signal line in an (n+1)-th stage.

6. The display substrate of claim 4, wherein the first reset transistor comprises a first reset active layer, the second reset transistor comprises a second reset active layer, an extension direction of a channel region of the first reset active layer is the same as an extension direction of the data signal line, and an extension direction of a channel region of the second reset active layer is different from the extension direction of the channel region of the first reset active layer.

7. The display substrate of claim 6, wherein the display substrate comprises a plurality of repetitive units, at least one of the repetitive units comprises a first sub-pixel, a second sub-pixel, a third sub-pixel, and a fourth sub-pixel, and the first reset active layer comprises a channel region and first region and second region disposed on both sides of the channel region;

the first semiconductor layer comprises a plurality of first connect blocks, shared by first reset transistors in the first sub-pixel, the second sub-pixel, the third sub-pixel and the fourth sub-pixel, as a first region of the first reset active layer within at least one of the repetitive units.

8. The display substrate of claim 7, wherein the first conductive layer further comprises a first branch of the first scan signal line, and the first branch of the first scan signal line extending in a first direction;

the first branch of the first scan signal line is provided with an annular aperture structure that comprises a first connect strip and a second connect strip, and the first connect strip and the second connect strip form a first aperture that exposes the first connect block, and an orthographic projection of the first connect strip on the substrate is overlapped with an orthographic projection of the channel regions of the first reset active layers in the first sub-pixel and the second sub-pixel on the substrate, and an orthographic projection of the second connect strip on the substrate is overlapped with an orthographic projection of the channel regions of the first reset active layers in the third sub-pixel and the fourth sub-pixel on the substrate.

9. The display substrate of claim 8, wherein at least one of the repetitive units comprises an eighth via through which the first initial signal line is connected with the first connect block, and an orthographic projection of the first aperture on the substrate overlays with an orthographic projection of the eighth via on the substrate.

10. The display substrate of claim 7, wherein the first conductive layer further comprises a reset control signal line, and the second reset active layer comprises the channel region and a first region and a second region disposed on both sides of the channel region;

the reset control signal line is disposed between two adjacent rows of repetitive units, and the reset control signal line extends in a first direction and is provided with a plurality of first bumps extending in a second direction or a direction opposite to the second direction, and the plurality of first bumps are overlapped with channel regions of the second reset active layers in the first sub-pixel, the second sub-pixel, the third sub-pixel and the fourth sub-pixel.

11. The display substrate of claim 10, wherein the second initial signal line is disposed between two adjacent rows of repetitive units, and the second initial signal line extends in the first direction and is provided with a plurality of second bumps extending in the second direction or a direction opposite to the second direction, and the plurality of second bumps are connected to first regions of the second reset active layers in the first sub-pixel, the second sub-pixel, the third sub-pixel and the fourth sub-pixel through a via in an insulating layer.

12. The display substrate of claim 11, wherein an orthographic projection of the second initial signal line on the substrate is overlapped with an orthographic projection of the reset control signal line on the substrate.

13. The display substrate of claim 1, wherein the first conductive layer further comprises a second branch of the first scan signal line, and the second conductive layer further comprises a first branch of the second scan signal line;

both of the second branch of the first scan signal line and the first branch of the second scan signal line extend in a first direction, the second branch of the first scan signal line is provided with a third bump in each sub-pixel, and the first branch of the second scan signal line is provided with a fourth bump in each sub-pixel, and in each sub-pixel, a convex direction of the third bump is opposite to a convex direction of the fourth bump.

14. The display substrate of claim 13, wherein within each sub-pixel, an orthographic projection of an active layer of the oxide transistor on the substrate is overlapped with an orthographic projection of the third bump and fourth bump on the substrate.

15. The display substrate of claim 13, wherein the third conductive layer further comprises a second branch of the second scan signal line extending in the first direction, and within each sub-pixel, the second branch of the second scan signal line is provided with a fifth bump, and within each sub-pixel, a convex direction of the fifth bump is the same as the convex direction of the fourth bump; within each sub-pixel, an orthographic projection of the second branch of the second scan signal line on the substrate is overlapped with an orthographic projection of the first branch of the second scan signal line on the substrate.

16. The display substrate of claim 1, wherein the first conductive layer further comprises a light emitting control signal line and the first electrode plate of the storage capacitor;
the light emitting control signal line is extended in a first direction, and is provided with a sixth bump in each sub-pixel, and a convex direction of the sixth bump in each sub-pixel is a direction away from the first electrode plate of the storage capacitor.

17. The display substrate of claim 1, wherein the plurality of poly silicon transistors comprise a first light emitting control transistor, and a first light emitting control active layer of the first light emitting control transistor comprises a channel region and a first region and a second region disposed on both sides of the channel region;
the first semiconductor layer comprises a plurality of second connect blocks, and the second connect blocks are shared, by first light emitting control active layers in two adjacent sub-pixels, as a first region.

18. A display apparatus, comprising the display substrate of claim 1.

19. A method for manufacturing a display substrate comprising a plurality of sub-pixels, the method comprising:
forming, sequentially, a first semiconductor layer, a first conductive layer, a second conductive layer, a second semiconductor layer, a third conductive layer, a fourth conductive layer, and a fifth conductive layer on a substrate, wherein
the first semiconductor layer comprises active layers of a plurality of poly silicon transistors, the first conductive layer comprises gates of the plurality of poly silicon transistors, a first electrode plate of a storage capacitor and a first scan signal line, the second conductive layer comprises a second electrode plate of the storage capacitor, the second semiconductor layer comprises active layers of a plurality of oxide transistors, the third conductive layer includes gates of the plurality of oxide transistors, the fourth conductive layer comprises first electrodes and second electrodes of the plurality of poly silicon transistors, and first electrodes and second electrodes of the plurality of oxide transistors, and the fifth conductive layer comprises a first power supply line and a data signal line, and any two adjacent rows of sub-pixels are symmetrical in an extension direction of the first scan signal line, and
wherein first power supply lines in two adjacent columns of sub-pixels are connected with each other to form an integrated structure.

20. A display substrate, wherein:
in a direction perpendicular to the display substrate, the display substrate comprises a first semiconductor layer, a first conductive layer, a second conductive layer, a second semiconductor layer, a third conductive layer, a fourth conductive layer, and a fifth conductive layer that are sequentially disposed on a substrate;
the first semiconductor layer comprises active layers of a plurality of poly silicon transistors, the first conductive layer comprises gates of the plurality of poly silicon transistors, a first electrode plate of a storage capacitor and a first scan signal line, the second conductive layer comprises a second electrode plate of the storage capacitor, the second semiconductor layer comprises active layers of a plurality of oxide transistors, the third conductive layer comprises gates of the plurality of oxide transistors, the fourth conductive layer comprises first electrodes and second electrodes of the plurality of poly silicon transistors, and first electrodes and second electrodes of the plurality of oxide transistors, and the fifth conductive layer comprises a first power supply line and a data signal line;
in a direction parallel to the display substrate, the display substrate comprises a plurality of sub-pixels, and any two adjacent rows of sub-pixels are symmetrical in an extension direction of the first scan signal line;
any two adjacent columns of sub-pixels are symmetrical along an extension direction of the data signal line;
the first scan signal line comprises a first branch and a second branch, and the fifth conductive layer further comprises an anode connection electrode; and
an orthographic projection of the first branch of the first scan signal line on the substrate is overlapped with an orthographic projection of the anode connection electrode on the substrate.

* * * * *